(12) United States Patent
Sakai et al.

(10) Patent No.: US 9,755,094 B2
(45) Date of Patent: Sep. 5, 2017

(54) IMAGING DEVICE

(71) Applicant: RENESAS ELECTRONICS CORPORATION, Tokyo (JP)

(72) Inventors: Atsushi Sakai, Tokyo (JP); Katsumi Eikyu, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/948,190

(22) Filed: Nov. 20, 2015

(65) Prior Publication Data
US 2016/0163897 A1   Jun. 9, 2016

(30) Foreign Application Priority Data
Dec. 3, 2014 (JP) ................. 2014-244944

(51) Int. Cl.
*H01L 27/146* (2006.01)
*H01L 31/0352* (2006.01)
*H01L 31/103* (2006.01)

(52) U.S. Cl.
CPC .... *H01L 31/03529* (2013.01); *H01L 27/1461* (2013.01); *H01L 27/1463* (2013.01); *H01L 27/14607* (2013.01); *H01L 27/14612* (2013.01); *H01L 27/14621* (2013.01); *H01L 27/14627* (2013.01); *H01L 27/14643* (2013.01); *H01L 27/14689* (2013.01); *H01L 31/103* (2013.01); *Y02E 10/50* (2013.01)

(58) Field of Classification Search
CPC . H01L 33/504; H01L 33/58; H01L 31/03529; H01L 27/14607; H01L 27/1461; H01L 27/14612; H01L 27/14621; H01L 27/14627; H01L 27/1463; H01L 27/14689; H01L 31/103; Y02E 10/50

USPC ......................................................... 257/466
See application file for complete search history.

(56) References Cited

U.S. PATENT DOCUMENTS

2001/0036714 A1* 11/2001 Kitani ............... H01L 21/26513
                                                        438/525

FOREIGN PATENT DOCUMENTS

JP    2000-031451 A    1/2000
JP    2005-332925 A    12/2005

OTHER PUBLICATIONS

NPL Machine Translation JP 2005-332925.*
NPL Machine Translation JP 2000-031451.*

* cited by examiner

*Primary Examiner* — Trung Q Dang
*Assistant Examiner* — Patricia Reddington
(74) *Attorney, Agent, or Firm* — McDermott Will & Emery LLP

(57) ABSTRACT

To provide an imaging device equipped with a photodiode, which is capable of enhancing both of a capacity and sensitivity.
In an area of a P-type well in which a photodiode is formed, a P-type impurity region is formed from the surface of the P-type well to a predetermined depth. Further, an N-type impurity region is formed to extend to a deeper position. N-type impurity regions and P-type impurity regions respectively extending in a gate width direction from a lower part of the N-type impurity region to a deeper position so as to contact the N-type impurity region are alternately arranged in a plural form along a gate length direction in a form to contact each other.

15 Claims, 47 Drawing Sheets

IMAGING DEVICE

CROSS-REFERENCE TO RELATED APPLICATIONS

The disclosure of Japanese Patent Application No. 2014-244944 filed on Dec. 3, 2014 including the specification, drawings and abstract is incorporated herein by reference in its entirety.

BACKGROUND

The present invention relates to an imaging device and is suitably available in, for example, an imaging device equipped with a photodiode.

An imaging device equipped with, for example, a CMOS (Complementary Metal Oxide Semiconductor) image sensor is applied to a digital camera or the like. This imaging device is also called a CIS (CMOS Image Sensor). In the imaging device, a photodiode is formed to convert incident light into an electric charge.

The electric charge generated in the photodiode is transferred to a floating diffusion region by a transfer transistor. The transferred electric charge is converted into an electric signal by an amplifying transistor and outputted as an image signal. Incidentally, as examples of Patent Documents that have disclosed such an imaging device, there have been known Patent Document 1 and Patent Document 2.

RELATED ART DOCUMENTS

Patent Documents

[Patent Document 1] Japanese Unexamined Patent Publication Laid-Open No. 2000-31451
[Patent Document 2] Japanese Unexamined Patent Publication Laid-Open No. 2005-332925

SUMMARY

An imaging device has been required to clearly and distinctly capture the brightness and darkness. In order to clearly capture the brightness and darkness in a bright place, it is required for the photodiode to have a capacity to prevent generated photoelectrons from overflowing. That is, it is required for the photodiode to increase the number of saturation electrons. On the other hand, in order to clearly capture the brightness and darkness in a dark place, the photodiode needs sensitivity (collection efficiency of photoelectrons) in such a manner that the generated photoelectrons can efficiently be collected even with a small amount of light.

Generally, in the photodiode, the capacity (number of saturation electrons) and the sensitivity (collection efficiency of photoelectrons) are placed in a trade-off relationship. Therefore, there is a tendency that the sensitivity is reduced when an attempt is made to increase the capacity, whereas the capacity is reduced when an attempt is made to improve the sensitivity. It was a difficult situation for the photodiode to improve both of the capacity and the sensitivity.

Other problems and novel features will be apparent from the description of the present specification and the accompanying drawings.

An imaging device according to one aspect of the present invention has an element forming area of a first conductivity type, and a photoelectric conversion unit formed in a first area of the element forming area divided by an electrode unit. The photoelectric conversion unit includes a first impurity region of a first conductivity type, a second impurity region of a second conductivity type, a third impurity region of a first conductivity type, and a fourth impurity region of a second conductivity type. The first impurity region of the first conductivity type is formed from the surface of the element forming area to a first depth. The second impurity region of the second conductivity type is formed from a first depth to a second depth deeper than the first depth so as to contact the first impurity region. The third impurity region of the first conductivity type extends in a first direction and is formed from the second depth to a position deeper than the second depth in a form to contact the second impurity region. The fourth impurity region of the second conductivity type extends in the first direction and is formed from the second depth to a position deeper than the second depth in a form to contact the second impurity region. The third impurity region and the fourth impurity region are alternately arranged in a plural form along the second direction crossing the first direction in a form to contact each other.

An imaging device according to another aspect of the present invention has an element forming area of a first conductivity type having a first impurity concentration, and a photoelectric conversion unit formed in a first area of the element forming area divided by an electrode unit. The photoelectric conversion unit includes a first impurity region of a first conductivity type, a second impurity region of a first conductivity type, and a third impurity region of a second conductivity type. The first impurity region of the first conductivity type is formed from the surface of the element forming area to a first depth. The second impurity region of the first conductivity type extends in a second direction crossing a first direction and is formed from the first depth to a position deeper than the first depth in a form to contact the first impurity region. The third impurity region of the second conductivity type extends in the second direction and is formed from the first depth to a position deeper than the first depth in a form to contact the first impurity region. The second impurity region and the third impurity region are alternately arranged in a plural form along the first direction in a form to contact each other.

An imaging device according to a further aspect of the present invention has an element forming area of a first conductivity type having a first impurity concentration, and a photoelectric conversion unit formed in a first area of the element forming area divided by an electrode unit. An element isolation area includes an impurity isolation region of a first conductivity type formed from a main surface of a semiconductor substrate to a first depth. The photoelectric conversion unit includes a first impurity region of a first conductivity type, a second impurity region of a second conductivity type, and a third impurity region of a second conductivity type. The first impurity region of the first conductivity type is formed from the surface of the element forming area to a second depth shallower than the first depth. The second impurity region of the second conductivity type is formed from the second depth to a third depth shallower than the first depth so as to contact the first impurity region. The third impurity region of the second conductivity type is in contact with the second impurity region and formed from the third depth to a position deeper than the third depth along the impurity isolation region while contacting the impurity isolation region.

According to the imaging device according to one aspect of the present invention, it is possible to improve both a capacity and sensitivity at a photoelectric conversion unit.

According to the imaging device according to another aspect of the present invention, it is possible to improve both a capacity and sensitivity at a photoelectric conversion unit.

According to the imaging device according to a further aspect of the present invention, it is possible to improve both a capacity and sensitivity at a photoelectric conversion unit.

DETAILED DESCRIPTION

Figure 1:
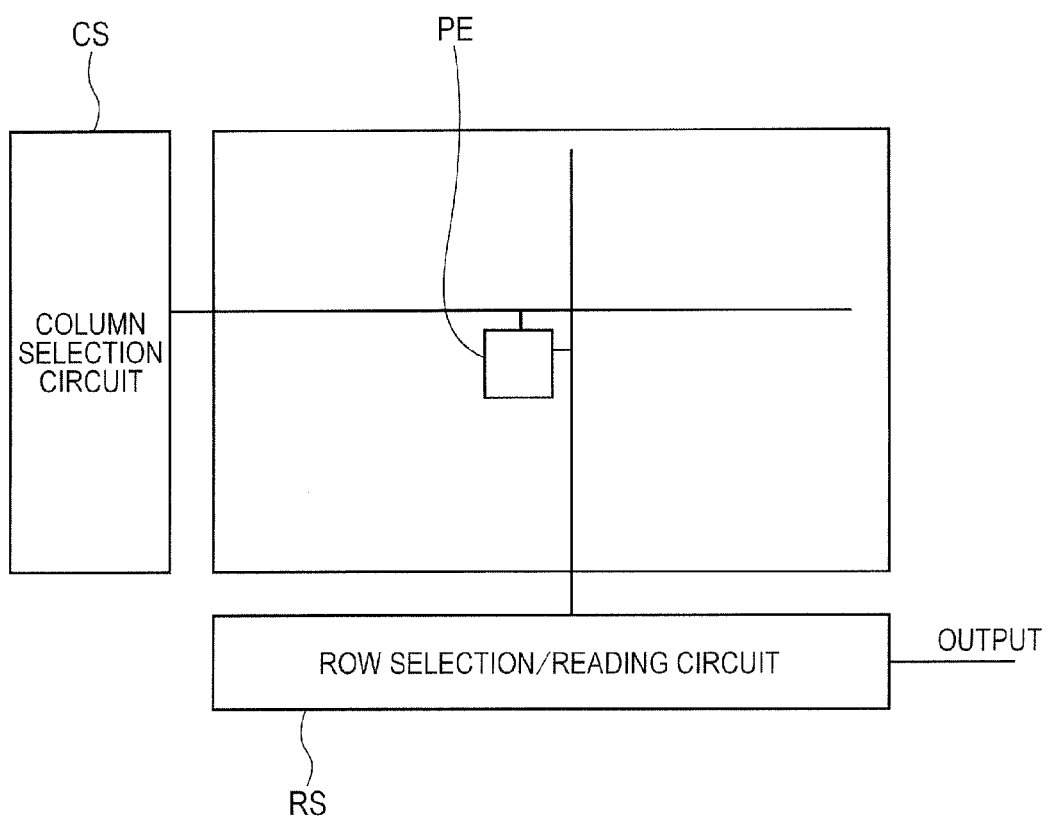
FIG. 1 is a block diagram of an imaging device according to each embodiment.
Figure 2:
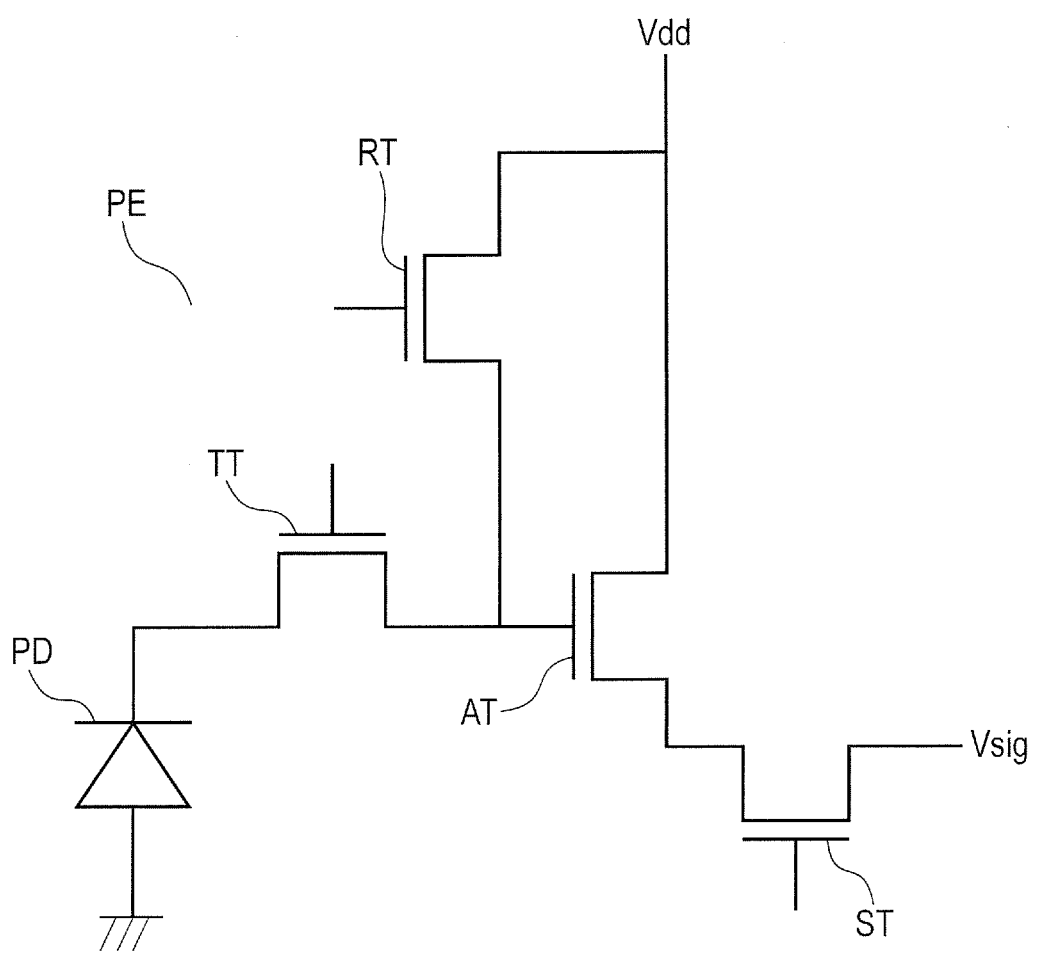
FIG. 2 is an equivalent circuit diagram of a pixel in the imaging device according to each embodiment.

An entire configuration (circuit) of an imaging device will first be described. The imaging device is comprised of a plurality of pixels arranged in a matrix form. As shown in FIG. 1, a column selection circuit CS and a row selection/reading circuit RS are coupled to a pixel PE. Incidentally, for simplification of the drawing, FIG. 1 shows one pixel PE of a plurality of pixels. As shown in FIG. 2, the pixel is provided with a photodiode PD, a transfer transistor TT, an amplifying transistor AT, a selecting transistor ST, and a resetting transistor RT.

Light from a subject is accumulated in the photodiode PD as an electric charge. The transfer transistor TT transfers the electric charge to a floating diffusion region (not shown). The resetting transistor RT resets the electric charge of the floating diffusion region before the electric charge is transferred to the floating diffusion region. The electric charge transferred to the floating diffusion region is inputted to a gate electrode of the amplifying transistor AT, where it is converted to a voltage (Vdd) and amplified. When a signal for selecting a particular row of pixels is inputted to a gate electrode of the selecting transistor ST, a signal converted to the voltage is read as an image signal (Vsig).

In each embodiment, the structure of a photodiode in an imaging device will specifically be described below.

First Embodiment

A photodiode and the like of an imaging device according to a first embodiment will be described.

As shown in FIGS. 3, 4, 5, and 6, in an imaging device IS, a P type well PW (impurity concentration: about $5 \times 10^{16}/cm^3$ or so) as an element forming area is defined by forming a trench isolation insulting film STI and an isolation P-type region PIR in a predetermined area in a semiconductor substrate SUB. A gate electrode TGE of a transfer transistor TT extending in a Y direction is formed so as to cross the P-type well PW. The gate electrode TGE is formed over the P-type well PW through a gate insulating film GZF interposed therebetween.

A photodiode PD is formed in an area (A) of both areas of the P-type well PW, which is located on one side (negative side in an X direction) with the gate electrode TGE interposed therebetween. A floating diffusion region FD of the transfer transistor TT is formed in an area (B) of the P-type well PW located on the other side (positive side in the X direction) with the gate electrode TGE interposed therebetween.

In the area A, a P-type impurity region PSR (impurity concentration: about $1 \times 10^{18}/cm^3$ or more) is formed from the surface of the semiconductor substrate SUB (P-type well PW) to a predetermined depth. An N-type impurity region PD1N (impurity concentration: about $3 \times 10^{17}/cm^3$ or so) is formed from the lower part of the P-type impurity region PSR to a deeper position so as to contact the P-type impurity region PSR.

Each of N-type impurity regions PD2N (impurity concentration: about $2 \times 10^{17}/cm^3$ or so) is formed from the lower part of the N-type impurity region PD1N to a deeper position so as to contact the N-type impurity region PD1N. Further, each of P-type impurity regions PD2P (impurity concentration: about $4 \times 10^{17}/cm^3$ or so) is formed from the lower part of the N-type impurity region PD1N to a deeper position so as to be in contact with the N-type impurity region PD1N.

The N-type impurity region PD2N extends in the Y direction with a depth (about 0.1 μm or so) and the P-type impurity region PD2P extends in the Y direction with a width (about 0.05 μm or so). The N-type impurity regions PD2N and the P-type impurity regions PD2P are alternately arranged in a plural form along the X direction in the form in which they are in contact with each other (they have junction surfaces). The junction surfaces thereof are positioned so as to be substantially orthogonal to the surface of the semiconductor substrate SUB (P-type well PW).

Incidentally, although the present embodiment has been described here by taking for example the case where the impurity concentration of the P-type impurity region PD2P is higher than that of the P-type well PW, and the impurity concentration of the N-type impurity region PD2N is lower than that of the N-type impurity region PD1N, this is one example, and it is also assumed that the relation of magnitude between the impurity concentrations is reversed.

On the other hand, in the area B, the N-type floating diffusion region FD is formed from the surface of the semiconductor substrate SUB (P-type well PW) to a predetermined depth. An electric charge generated in the photodiode PD is transferred to the floating diffusion region FD by the transfer transistor TT.

An interlayer insulating film IL1 comprised of, for example, a silicon oxide film or the like is formed so as to cover the photodiode PD and the transfer transistor TT, etc. A plug PG is formed in a contact hole CH which penetrates the interlayer insulating film IL1. A wiring WH is formed over the surface of the interlayer insulating film IL1. The wiring WH is electrically coupled to the floating diffusion region FD through the plug PG.

An interlayer insulating film IL2 comprised of, for example, a silicon oxide film or the like is further formed so as to cover the wiring WH. A color filter CF is formed over the interlayer insulating film IL2. A microlens ML is formed over the color filter CF. The microlens ML is arranged at a position corresponding to immediately above the photodiode PD. The imaging device IS according to the first embodiment is configured as described above.

An example of a manufacturing method of the imaging device IS described above will next be described. First, according to a general method, a trench isolation insulating film STI and an isolation P-type region PIR are formed in a semiconductor substrate SUB to thereby define an element forming area, and a P-type impurity is introduced in the element forming area to thereby form a P-type well PW.

Figure 7:
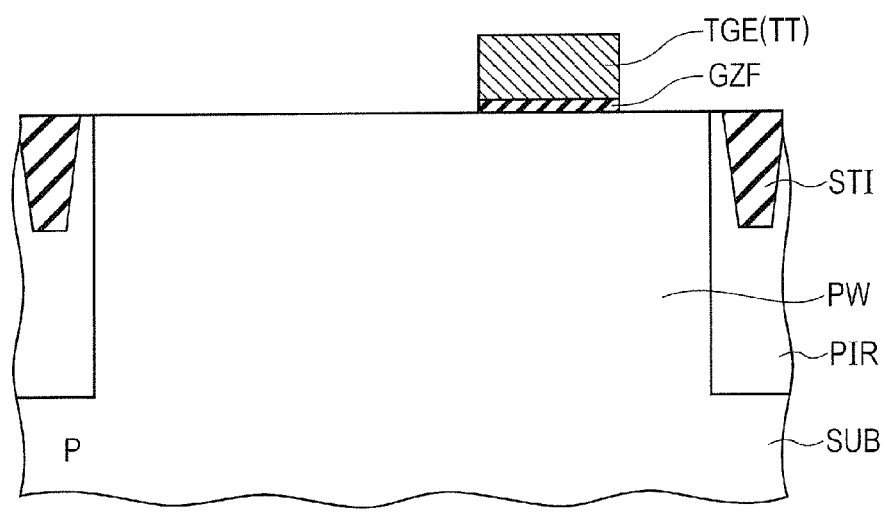
FIG. 7 is a sectional view showing one step of a manufacturing method of the imaging device in the same embodiment.

Next, a thermal oxidation process is performed to thereby form a thermal oxidation film (not shown) as a gate insulating film over the surface of the P-type well PW. A conductive film such as a polysilicon film or the like is formed so as to cover the thermal oxidation film. Next, a predetermined photoengraving process and etching process are performed so that a gate electrode TGE of a transfer transistor TT is formed as shown in FIG. 7. At this time, a gate electrode (not shown) of a predetermined transistor other than the transfer transistor is also formed simultaneously.

Figure 8:
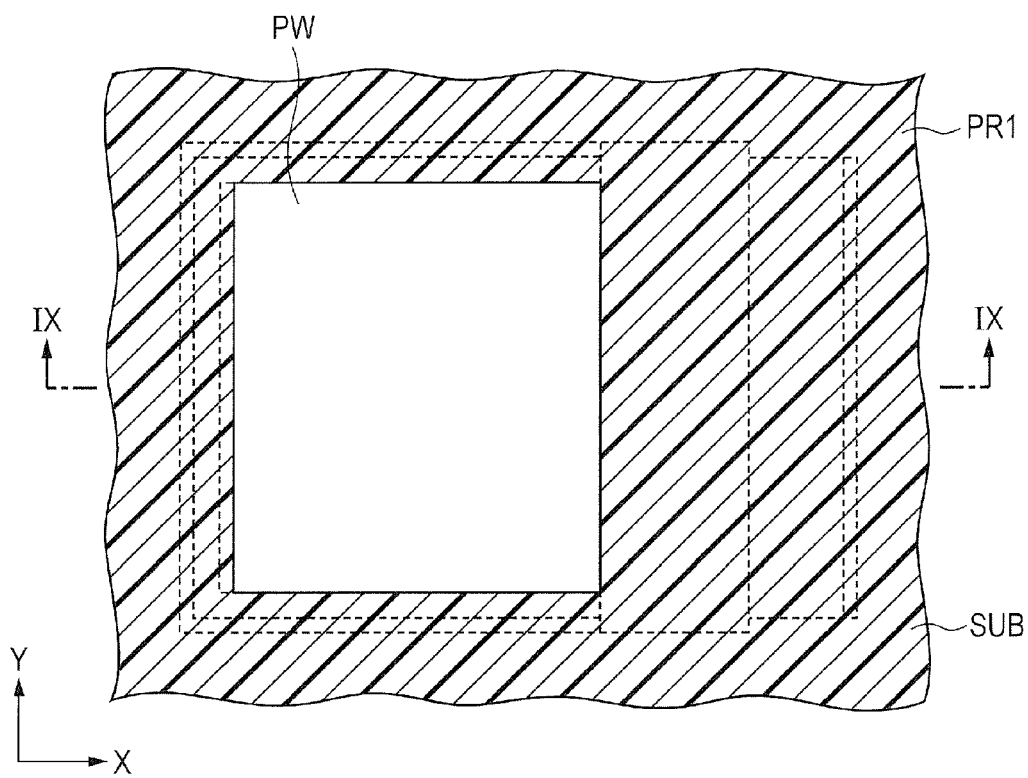
FIG. 8 is a plan view showing a step performed after the step shown in FIG. 7 in the same embodiment.
Figure 9:
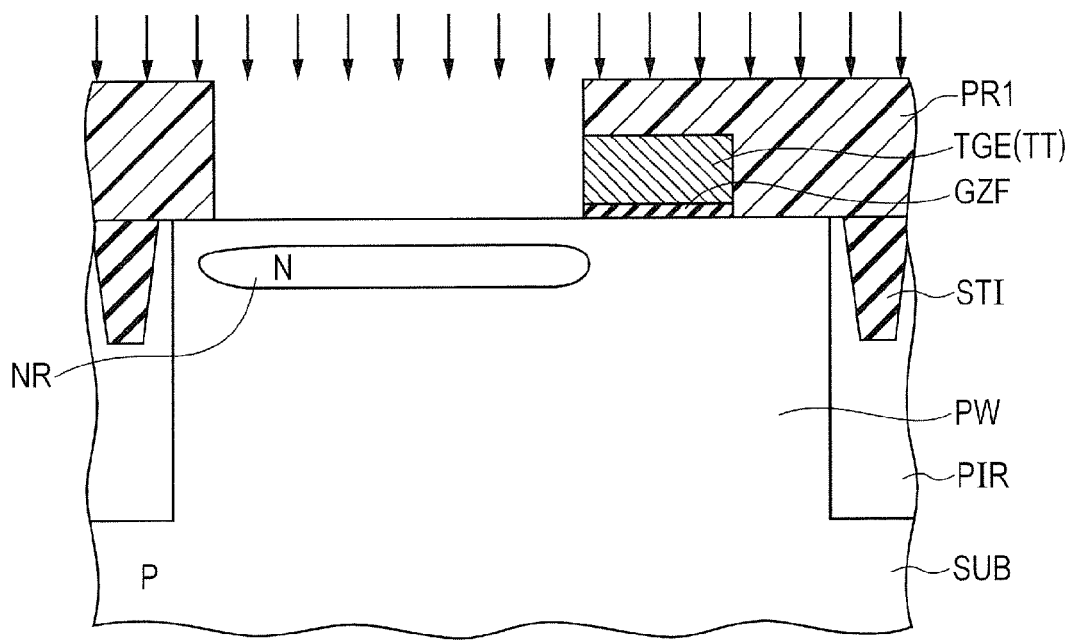
FIG. 9 is a sectional view showing a step performed after the step shown in FIG. 8, which is taken along a sectional line corresponding to a sectional line IX-IX shown in FIG. 8 in the same embodiment.

Next, a predetermined photoengraving process is performed as shown in FIG. 8 to thereby expose an area for the P-type well PW in which a photodiode is formed and form a photoresist pattern PR1 which covers other areas. Next, as shown in FIG. 9, an N-type impurity is implanted substantially vertically into the surface of the semiconductor substrate SUB (P-type well PW) with the photoresist pattern PR1 as an implantation mask to thereby form an N-type impurity region NR.

Figure 10:
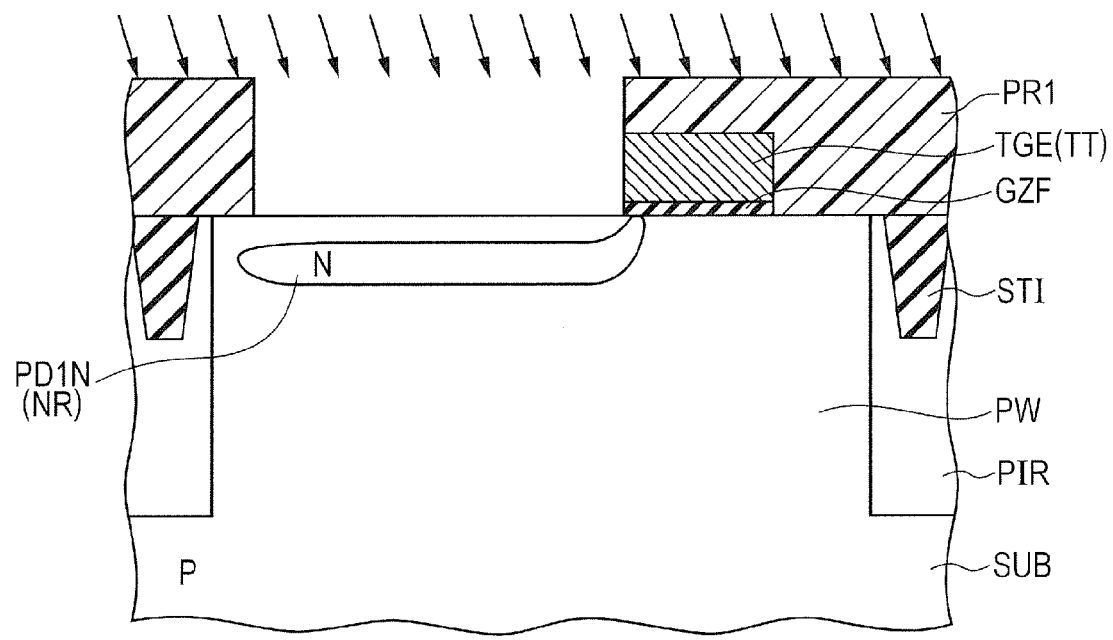
FIG. 10 is a sectional view showing a step performed after the step shown in FIG. 9 in the same embodiment.
Figure 11:
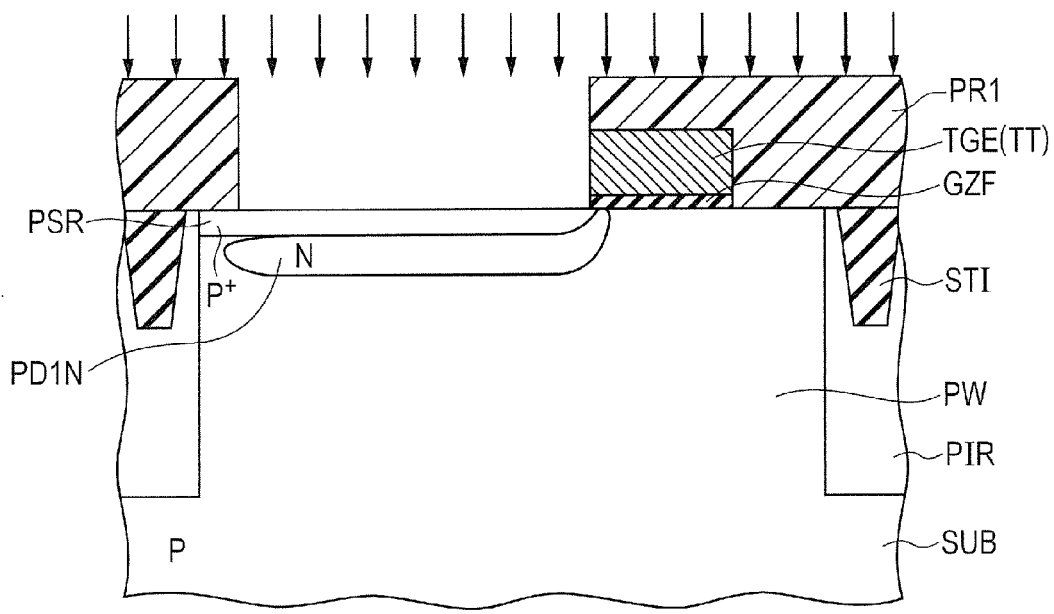
FIG. 11 is a sectional view showing a step performed after the step shown in FIG. 10 in the same embodiment.

Next, as shown in FIG. 10, an N-type impurity is implanted obliquely into the surface of the semiconductor substrate SUB (P-type well PW) with the photoresist pattern PR1 as the implantation mask. Consequently, an N-type impurity region PD1N which reaches up to a region immediately below a side wall portion of the gate electrode TGE, is formed. Next, as shown in FIG. 11, a P-type impurity region PSR is formed by implanting a P-type impurity with the photoresist pattern PR1 as the implantation mask. Thereafter, the photoresist pattern PR1 is removed.

Figure 12:
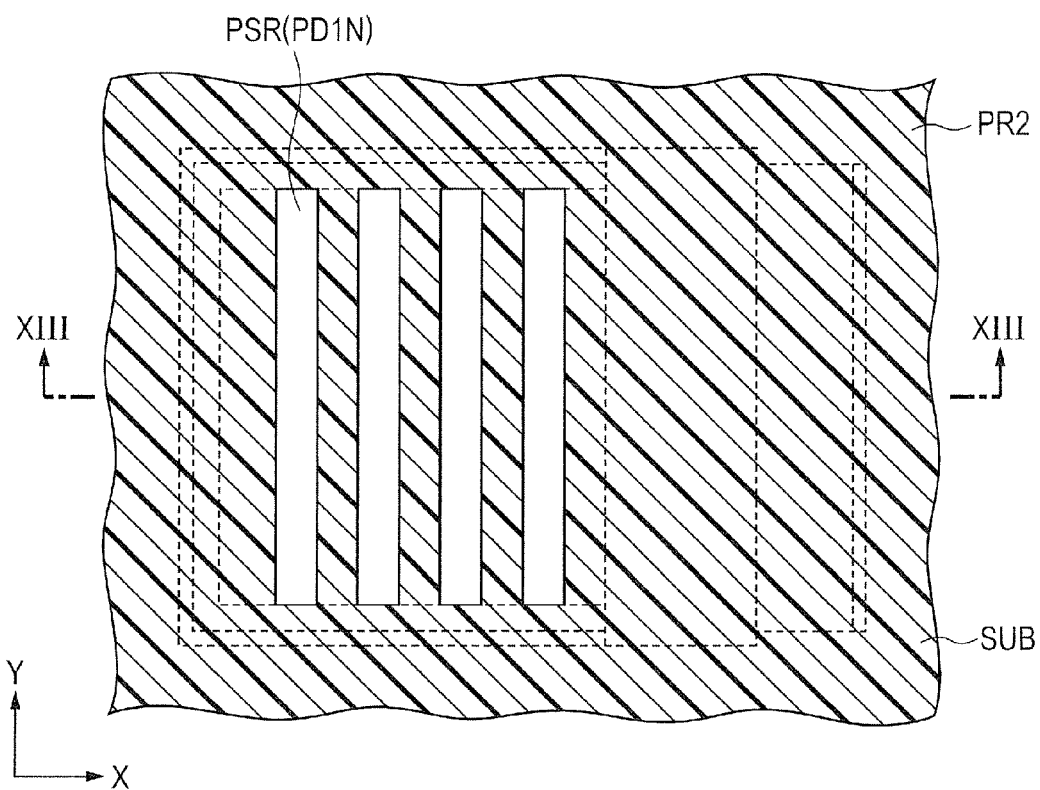
FIG. 12 is a plan view showing a step performed after the step shown in FIG. 11 in the same embodiment.
Figure 13:
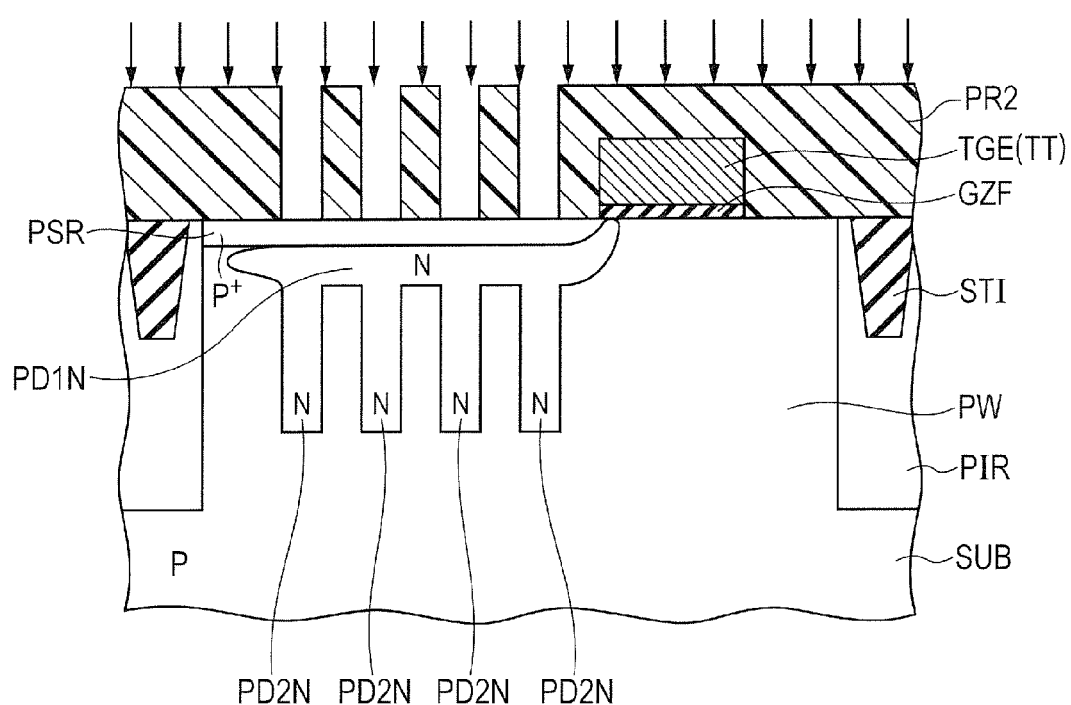
FIG. 13 is a sectional view showing a step performed after the step shown in FIG. 12, which is taken along a sectional line corresponding to a sectional line XIII-XIII shown in FIG. 12 in the same embodiment.

Next, as shown in FIG. 12, a predetermined photoengraving process is performed to thereby form a photoresist pattern PR2. The photoresist pattern PR2 is formed with opening patterns each having a width in an X direction and extending in a Y direction. Next, as shown in FIG. 13, an N-type impurity is implanted with relatively high implantation energy with the photoresist pattern PR2 as an implantation mask to thereby form N-type impurity regions PD2N. The photoresist pattern PR2 is removed.

Figure 14:
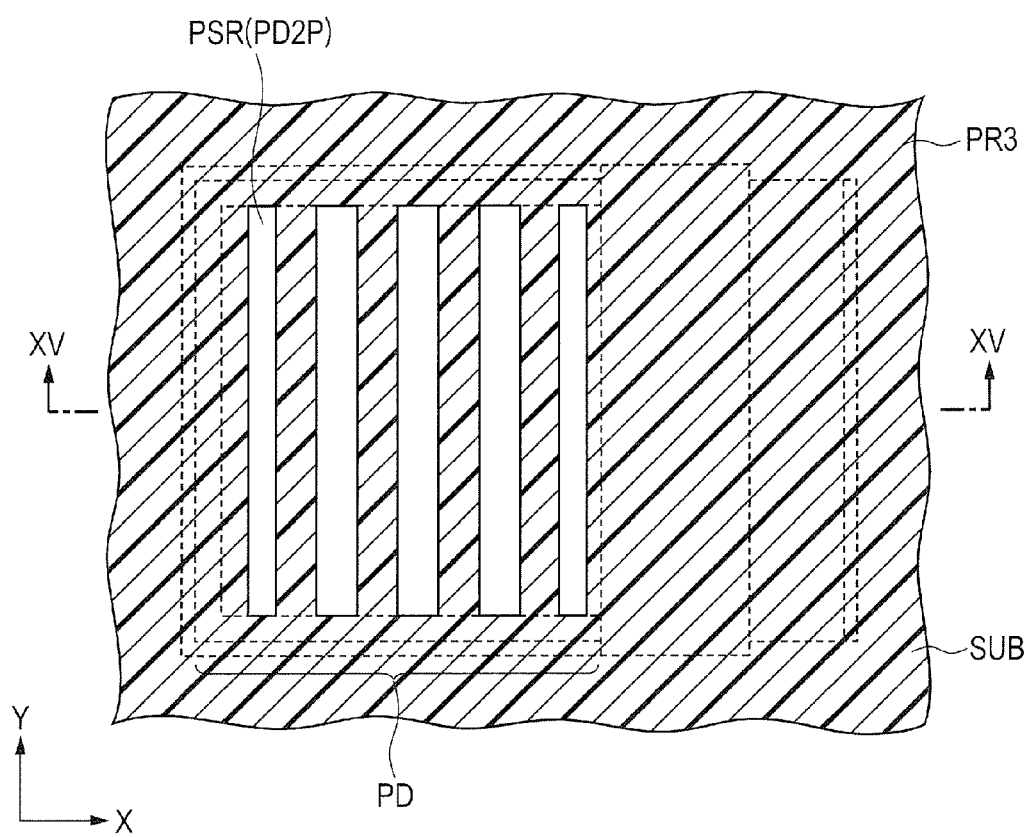
FIG. 14 is a plan view showing a step performed after the step shown in FIG. 13 in the same embodiment.
Figure 15:
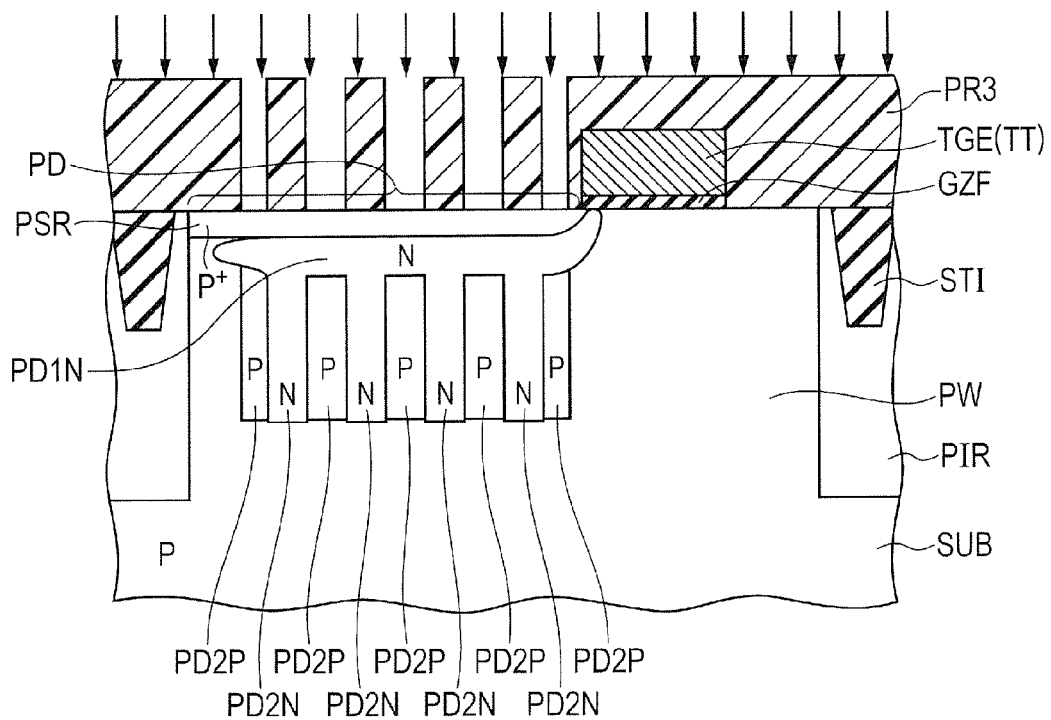
FIG. 15 is a sectional view showing a step performed after the step shown in FIG. 14, which is taken along a sectional line corresponding to a sectional line XV-XV shown in FIG. 14 in the same embodiment.

Next, as shown in FIG. 14, a predetermined photoengraving process is performed to thereby form a photoresist pattern PR3. The photoresist pattern PR3 is formed with opening patterns each having a width in the X direction and extending in the Y direction. Next, as shown in FIG. 15, a P-type impurity is implanted with relatively high implantation energy with the photoresist pattern PR3 as an implantation mask to thereby form P-type impurity regions PD2P. Thereafter, the photoresist pattern PR3 is removed. A photodiode PD is formed in the P-type well PW by the above steps.

Figure 16:
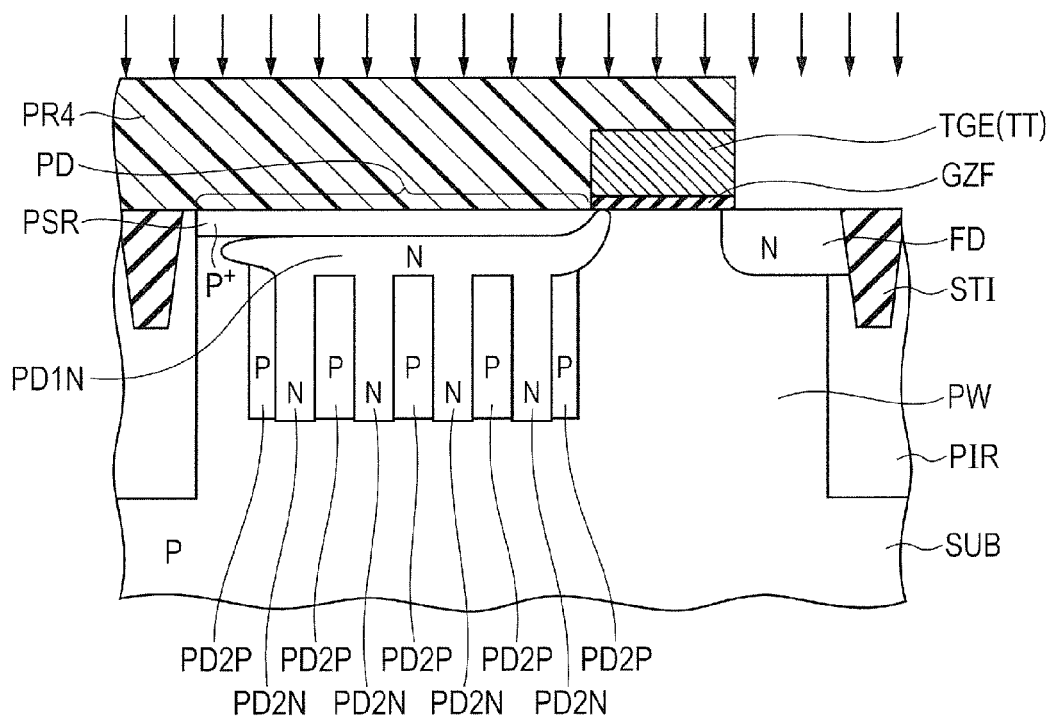
FIG. 16 is a sectional view showing a step performed after the step shown in FIG. 15 in the same embodiment.

Next, as shown in FIG. 16, a predetermined photoengraving process is performed to thereby expose an area of the P-type well PW in which a floating diffusion region is formed and hence form a photoresist pattern PR4 which covers other regions. Next, an N-type impurity is implanted with the photoresist pattern PR4 as an implantation mask to thereby form the floating diffusion region FD in the exposed area of the P-type well PW. Thereafter, the photoresist pattern PR4 is removed.

Figure 17:
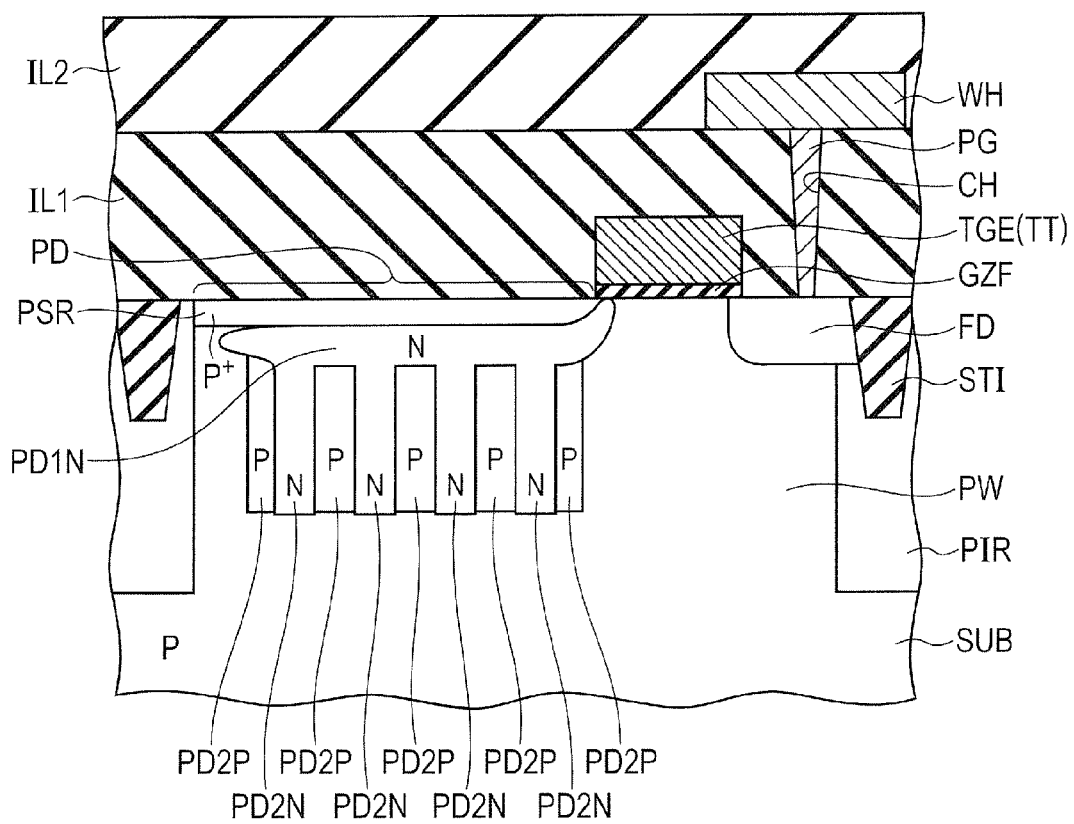
FIG. 17 is a sectional view showing a step performed after the step shown in FIG. 16 in the same embodiment.

Next, as shown in FIG. 17, an interlayer insulating film IL1 such as a silicon oxide film or the like is formed so as to cover the gate electrode TGE or the like by, for example, a CVD (Chemical Vapor Deposition) method. Next, a contact hole CH is formed which penetrates the interlayer insulating film IL1 and exposes the floating diffusion region FD. Next, a plug PG is formed in the contact hole CH. Next, a wiring WH electrically coupled to the plug PG is formed. Next, an interlayer insulating film IL2 such as a silicon oxide film or the like is formed so as to cover the wiring WH.

Figure 4:
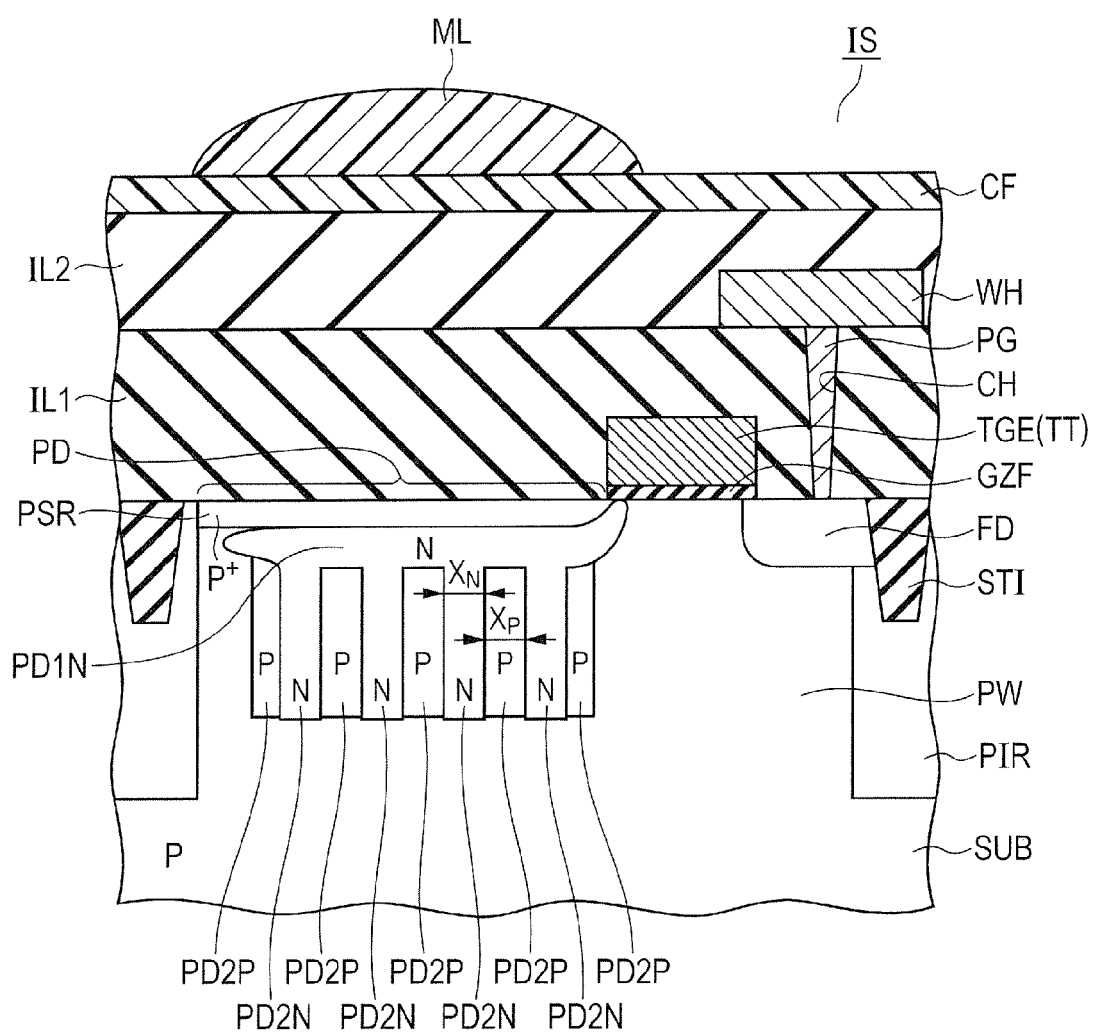
FIG. 4 is a sectional view taken along a sectional line IV-IV shown in FIG. 3 in the same embodiment.
Figure 5:
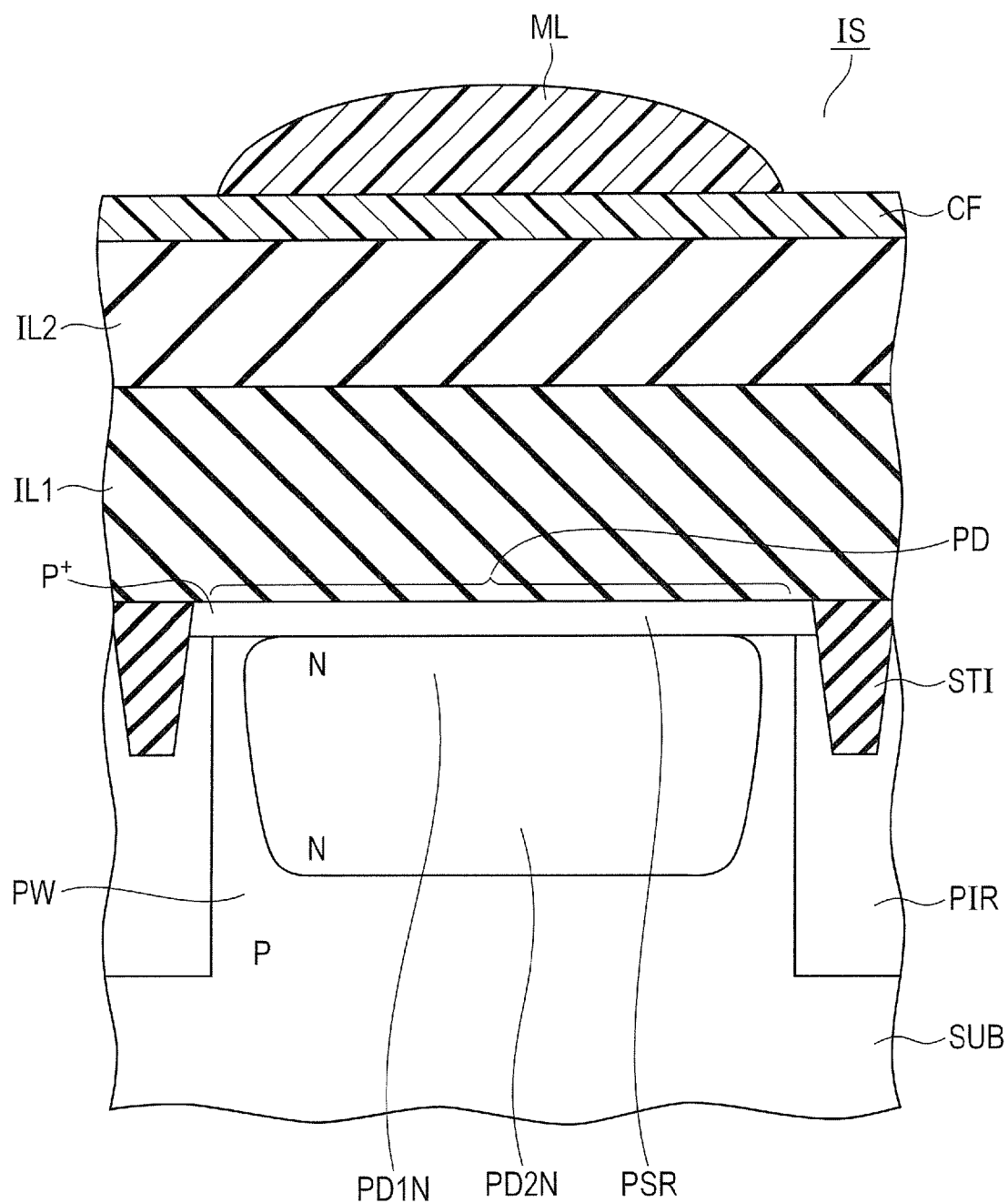
FIG. 5 is a sectional view taken along a sectional line V-V shown in FIG. 3 in the same embodiment.
Figure 6:
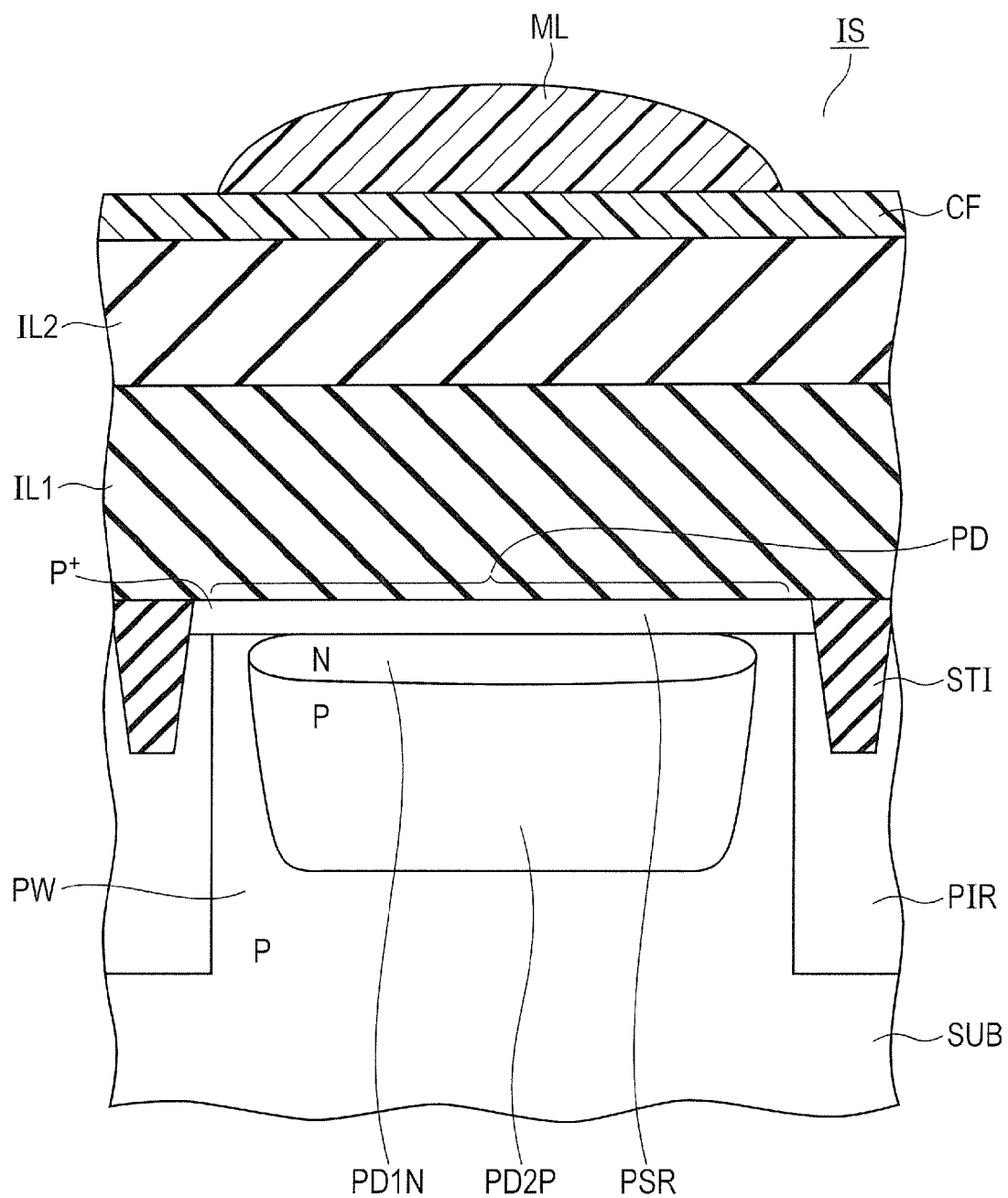
FIG. 6 is a sectional view taken along a sectional line VI-VI shown in FIG. 3 in the same embodiment.

Thereafter, color filters CF respectively colored in predetermined colors are formed, and a microlens ML (refer to FIG. 4) is further formed over each of the color filters CF to thereby complete the main part of the imaging device IS shown in FIG. 4 and the like.

In the above-described imaging device, the N-type impurity regions PD2N and the P-type impurity regions PD2P are formed from the lower part of the N-type impurity region PD1N to the deeper position in the form to be in contact with the N-type impurity region PD1N. Thus, it is possible to increase both of the capacity and sensitivity of the photodiode. This will be described in contradistinction with an imaging device according to a comparative example.

Figure 18:
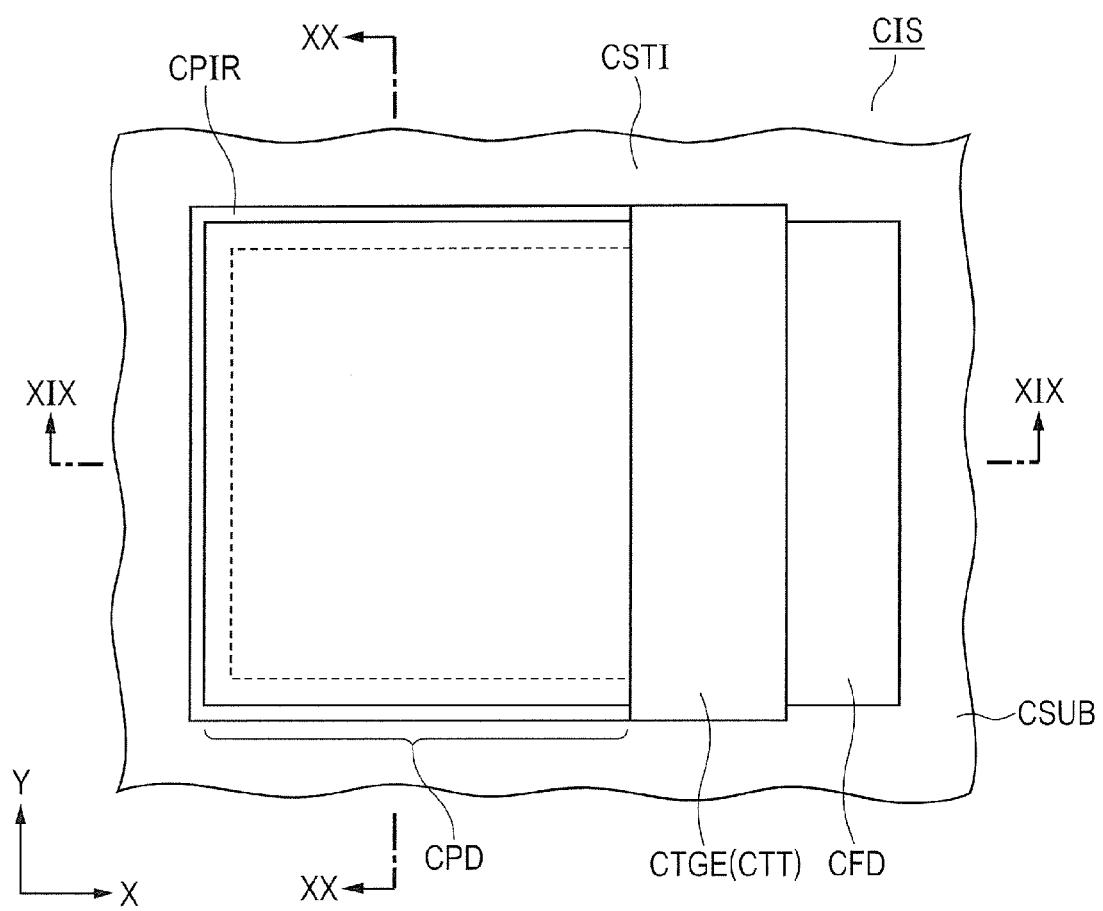
FIG. 18 is a plan view showing an area with a photodiode formed therein and its neighboring areas in an imaging device according to a comparative example.
Figure 19:
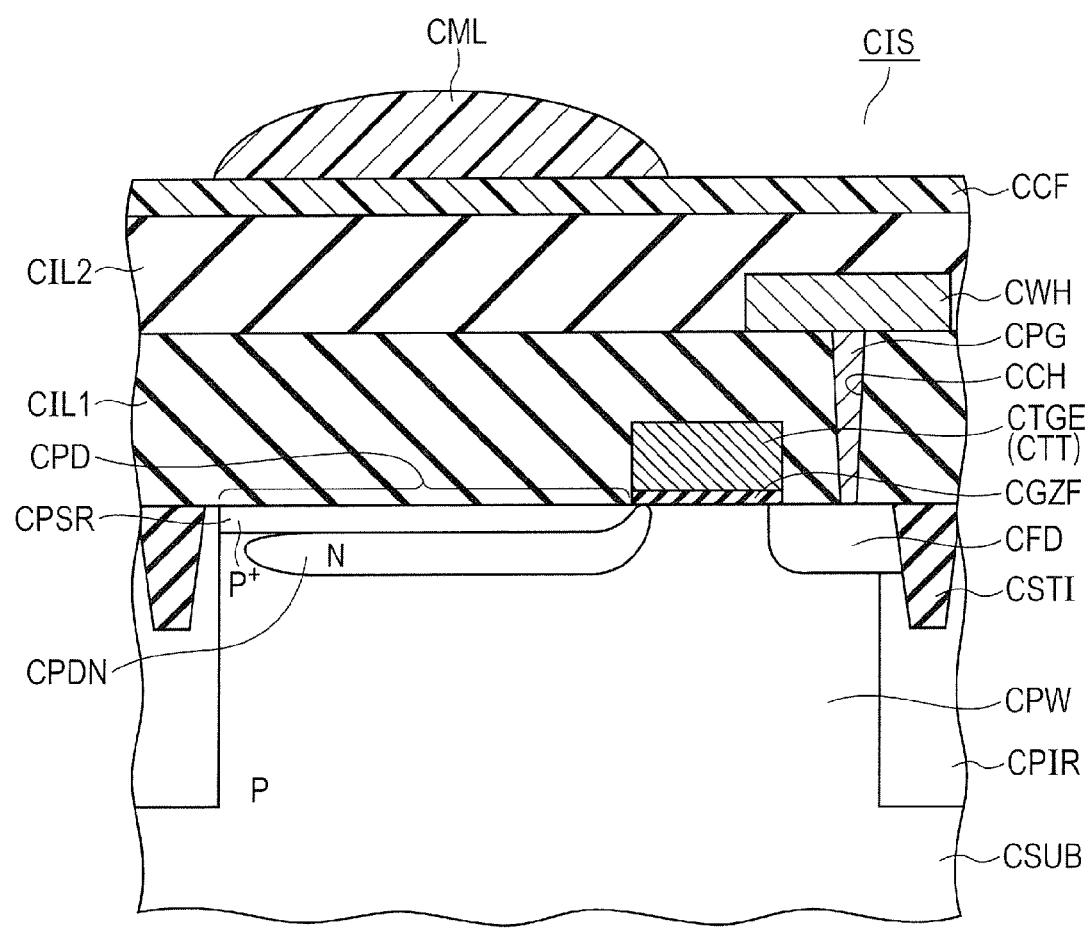
FIG. 19 is a sectional view taken along a sectional line XIX-XIX shown in FIG. 18.
Figure 20:
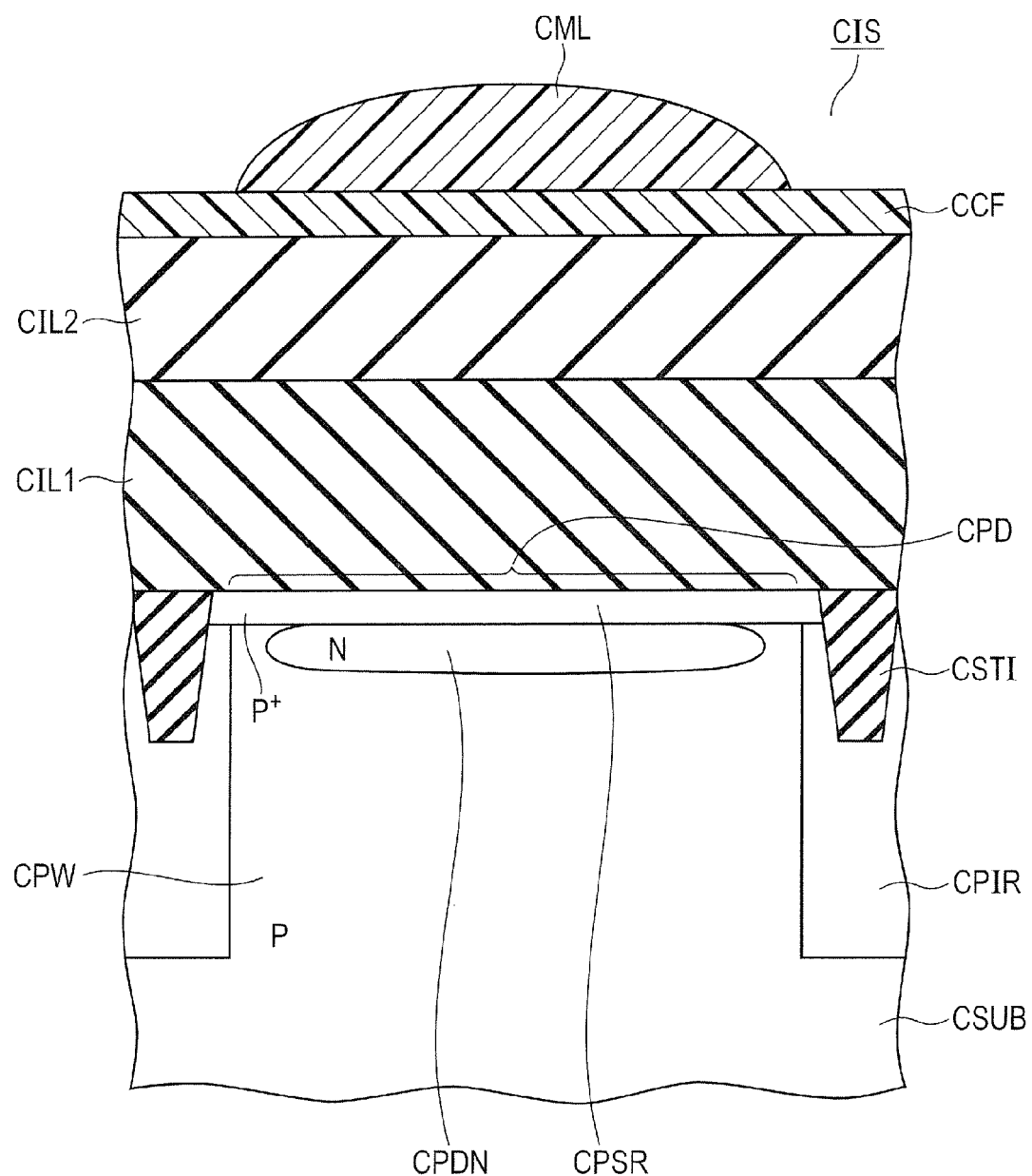
FIG. 20 is a sectional view taken along a sectional line XX-XX shown in FIG. 18.

As shown in FIGS. 18, 19, and 20, in a semiconductor substrate CSUB of an imaging device CIS according to a comparative example, a P-type well CPW is defined as an element forming area by a trench isolation insulating film CSTI and a isolation P-type region CPIR. A gate electrode CTGE of a transfer transistor CTT extending in a Y direction so as to cross the P-type well CPW is formed over the P-type well CPW with a gate insulating film CGZF interposed therebetween.

A photodiode CPD is formed in an area (A) of both areas of the P-type well CPW, which is located on one side (negative side in an X direction) with the gate electrode CTGE interposed therebetween. A floating diffusion region CFD is formed in an area (B) of the P-type well PW located on the other side (positive side in the X direction).

In the area A, a P-type impurity region CPSR is formed from the surface of the P-type well CPW to a predetermined depth. An N-type impurity region CPDN is formed from the lower part of the P-type impurity region CPSR to a deeper position so as to contact the P-type impurity region CPSR.

An interlayer insulating film CIL1 is formed so as to cover the photodiode CPD and the like. A plug CPG is formed in a contact hole CCH which penetrates the interlayer insulating film CIL1. A wiring CWH is formed over the surface of the interlayer insulating film CIL1. An interlayer insulating film CIL2 is further formed so as to cover the wiring CWH. A color filter CCF and a microlens CML are formed over the interlayer insulating film CIL2. The imaging device CIS according to the comparative example is configured as described above.

As already described, in order to clearly capture the brightness and darkness, the capacity (number of saturation electrons) and the sensitivity (collection efficiency of secondary electrons) are required for the photodiode of the imaging device. In general, in an imaging device, a step of accumulating as electric charges, electrons generated by entering of light into a photodiode, and a step of transferring the accumulated electric charges to a floating diffusion region are alternately repeated. When the electric charges of the photodiode are transferred, the photodiode is depleted.

In order to secure the capacity, the photodiode CPD of the imaging device CIS according to the comparative example is needed to set high the impurity concentrations (PN junction concentration) of the N-type impurity region CPDN and the P-type well CPW. On the other hand, in order to improve the sensitivity, there is a need to extend a depletion layer when the photodiode CPD is completely depleted, to a position as deep as possible in the semiconductor substrate CSUB after the transfer of the electric charges.

Figure 21:
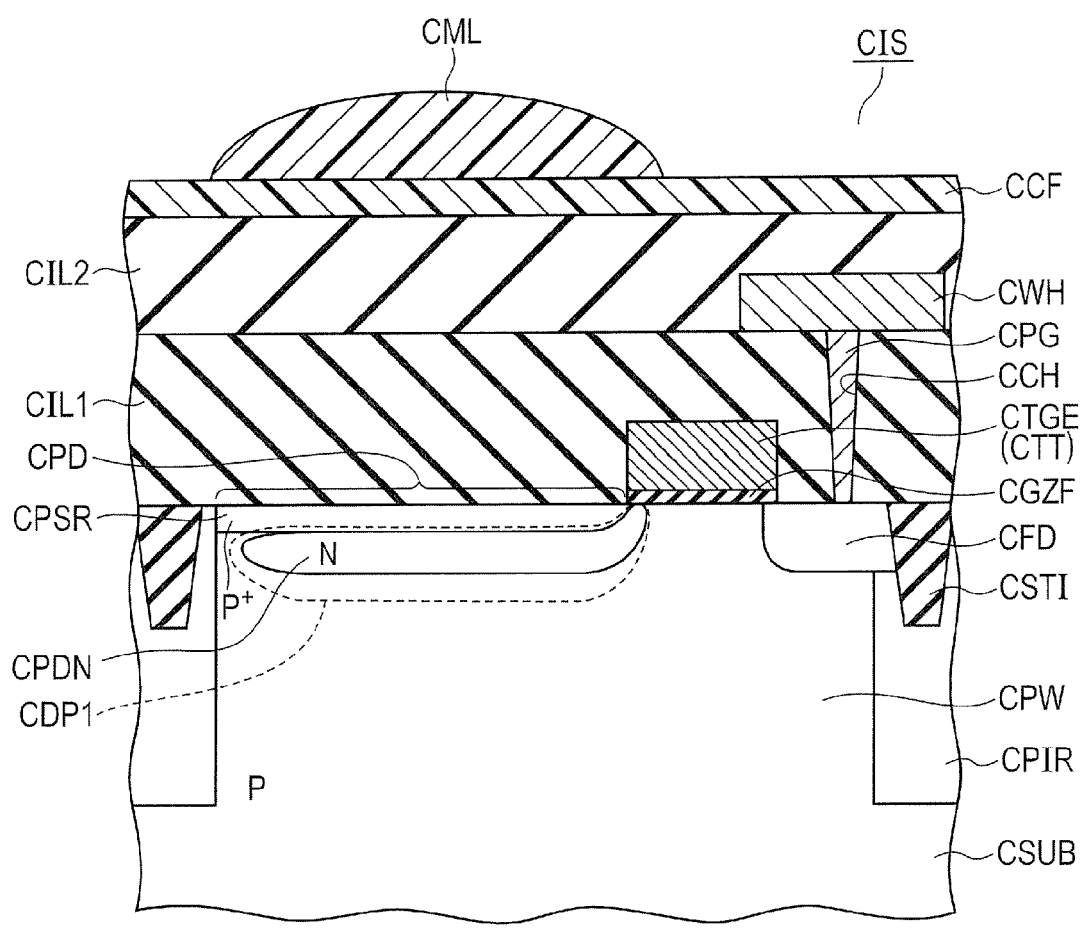
FIG. 21 is a first sectional view showing a depleted state of the photodiode in the imaging device according to the comparative example.
Figure 22:
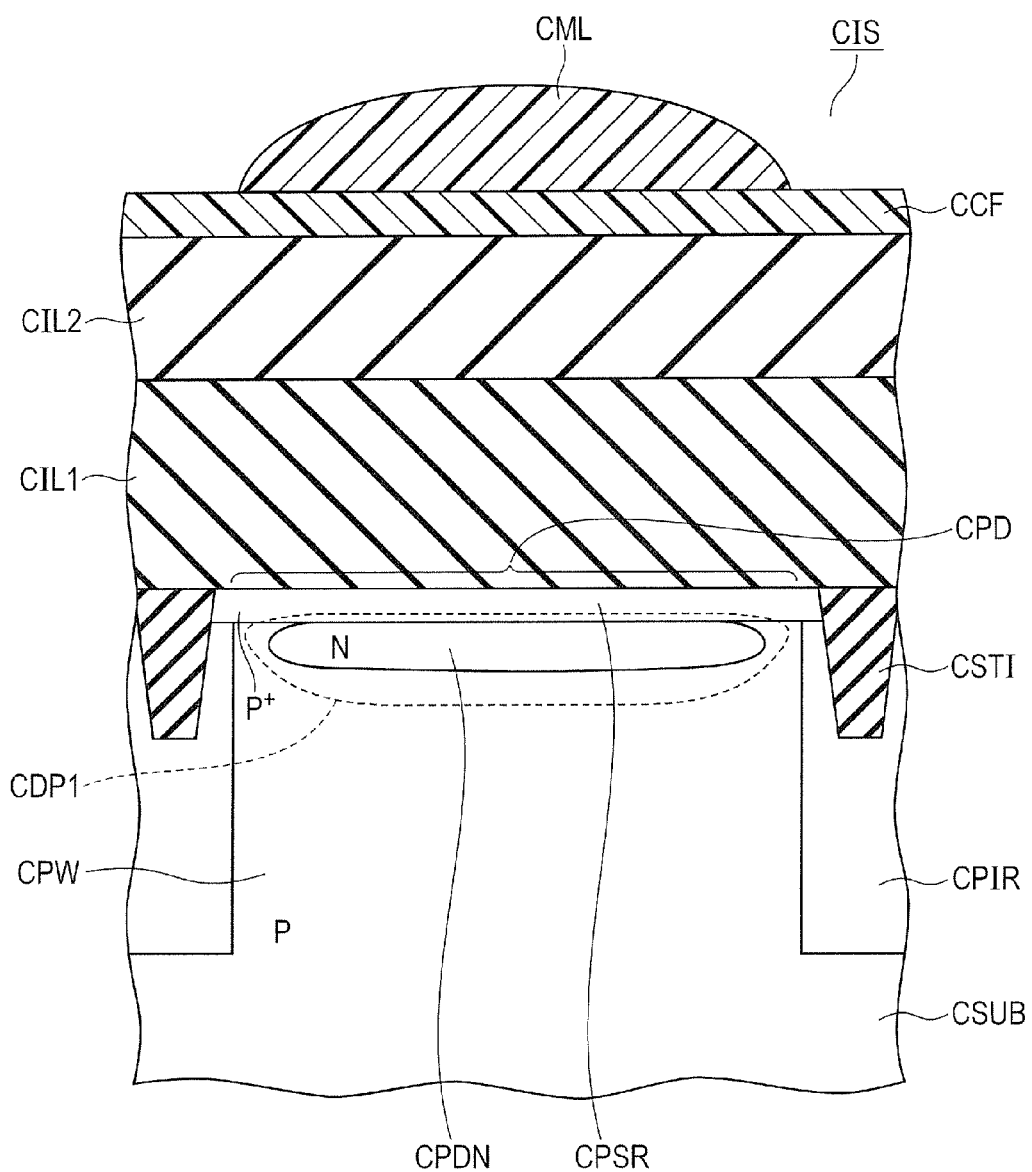
FIG. 22 is a second sectional view showing the depleted state of the photodiode in the imaging device according to the comparative example.

When the photodiode CPD is depleted, the end of the depletion layer (depletion layer end A) expands from a junction surface between the N-type impurity region CPDN and the P-type well CPW to the P-type well CPW, and the end of the depletion layer (depletion layer end B) expands toward the N-type impurity region CPDN. When the photodiode CPD is completely depleted, no depletion layer end B appears and only the depletion layer end A remains. FIGS. 21 and 22 show a depletion layer end CDP1 as the depletion layer end A.

When, however, the PN junction concentration is high, the depletion layer end CDP1 is not able to expand to a deep region of the P-type well CPW, and the width (length in a depth direction) of the depletion layer becomes relatively short. Therefore, the imaging device CIS according to the comparative example makes it hard to collect electrons generated at a relatively deep position of an area in which the photodiode is formed, and causes difficulty in increasing the sensitivity.

When an attempt is made to raise the sensitivity of the photodiode CPD in reverse, it is necessary to form the N-type impurity region CPDN to a deep region. There is however a need to set the impurity concentration low to bring the N-type impurity region CPDN into depletion. It is therefore not possible to increase the capacity (number of saturation electrons).

In contrast with the imaging device CIS according to the comparative example, in the area in which the photodiode PD of the above-described imaging device IS is formed, a plurality of N-type impurity regions PD2N and a plurality of P-type impurity regions PD2P are formed from the lower part of the N-type impurity region PD1N to a deeper position in the form to contact the N-type impurity region PD1N. The N-type impurity regions PD2N and the P-type impurity regions PD2P respectively extend in a Y direction with a predetermined width and are alternately arranged along an X direction in the form to contact each other (refer to FIGS. 3 to 6).

Now, assuming that a dielectric constant of silicon is $\in_{Si}$, an elementary charge quantity is q, an impurity concentration (acceptor concentration) of the P-type impurity region PD2P is $N_A$, an impurity concentration (donor concentration) of the N-type impurity region PD2N is $N_D$, and a depletion potential is $V_{dep2}$, the width $X_N$ of each N-type impurity region PD2N is set based on the following equation (1) and the width $X_P$ of each P-type impurity region PD2P is set based on the condition expressed in the following equation 2, in order to completely deplete the N-type impurity region PD2N and the P-type impurity region PD2P.

$$X_N = \sqrt{8 \frac{\varepsilon_{si}}{q} \frac{N_A}{N_D(N_D + N_A)} V_{dep2}} \quad (1)$$

$$X_P = \sqrt{8 \frac{\varepsilon_{si}}{q} \frac{N_D}{N_A(N_D + N_A)} V_{dep2}} \quad (2)$$

Incidentally, when the N-type impurity region PD1N is depleted ahead of the N-type impurity regions PD2N and the P-type impurity regions PD2P upon transferring the electric charges generated in the photodiode PD to the floating diffusion region FD, the electrical resistance in the N-type impurity region becomes extremely large. In doing so, the electric charges generated in the N-type impurity regions PD2N and the P-type impurity regions PD2P cannot be transferred.

Therefore, the depletion potential ($V_{dep1}$) of the N-type impurity region PD1N is set higher than the depletion potential ($V_{dep2}$) of each of the N-type impurity regions PD2N and the P-type impurity regions PD2P in such a manner that the N-type impurity regions PD2N and the P-type impurity regions PD2P are depleted ahead of the N-type impurity region PD1N. That is, the impurity concentrations of the P-type well PW, the N-type impurity region PD1N, the N-type impurity regions PD2N, and the P-type impurity regions PD2P are adjusted such that $V_{dep1} > V_{dep2}$.

Thus, in the above-described semiconductor device, the N-type impurity regions PD2N and the P-type impurity regions PD2P are first formed in addition to the N-type impurity region PD1N. Further, the impurity concentrations of the N-type impurity regions PD2N and the P-type impurity regions PD2P are set higher than the impurity concentration of the P-type well PW. As a result, the capacity (number of saturation electrons) of the photodiode PD can be increased as compared with the imaging device CIS according to the comparative example in which only the N-type impurity region CPDN is formed.

Further, the N-type impurity regions PD2N are respectively formed with the predetermined width ($X_N$). Furthermore, the P-type impurity regions PD2P are also respectively formed with the predetermined width ($X_P$). Thus, when the photodiode PD is depleted, the depletion layer end extending from one junction surface and the depletion layer end extending from the other junction surface are depleted with being coupled to each other in each of the N-type impurity regions PD2N. Further, the depletion layer end extending from one junction surface and the depletion layer end extending from the other junction surface are depleted with being coupled to each other even in each of the P-type impurity regions PD2P.

Figure 23:
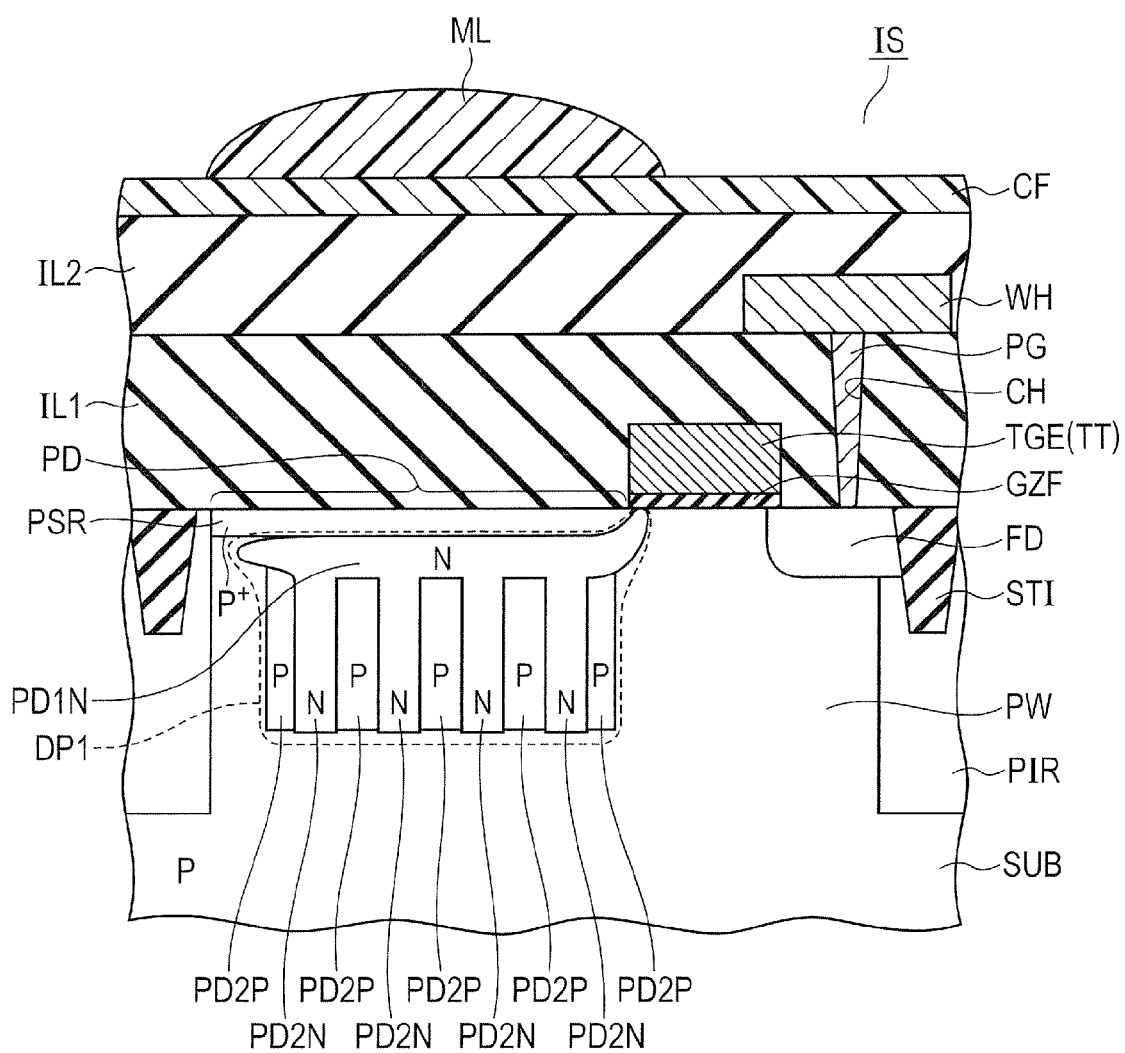
FIG. 23 is a first sectional view showing a depleted state of the photodiode in the same embodiment.
Figure 24:
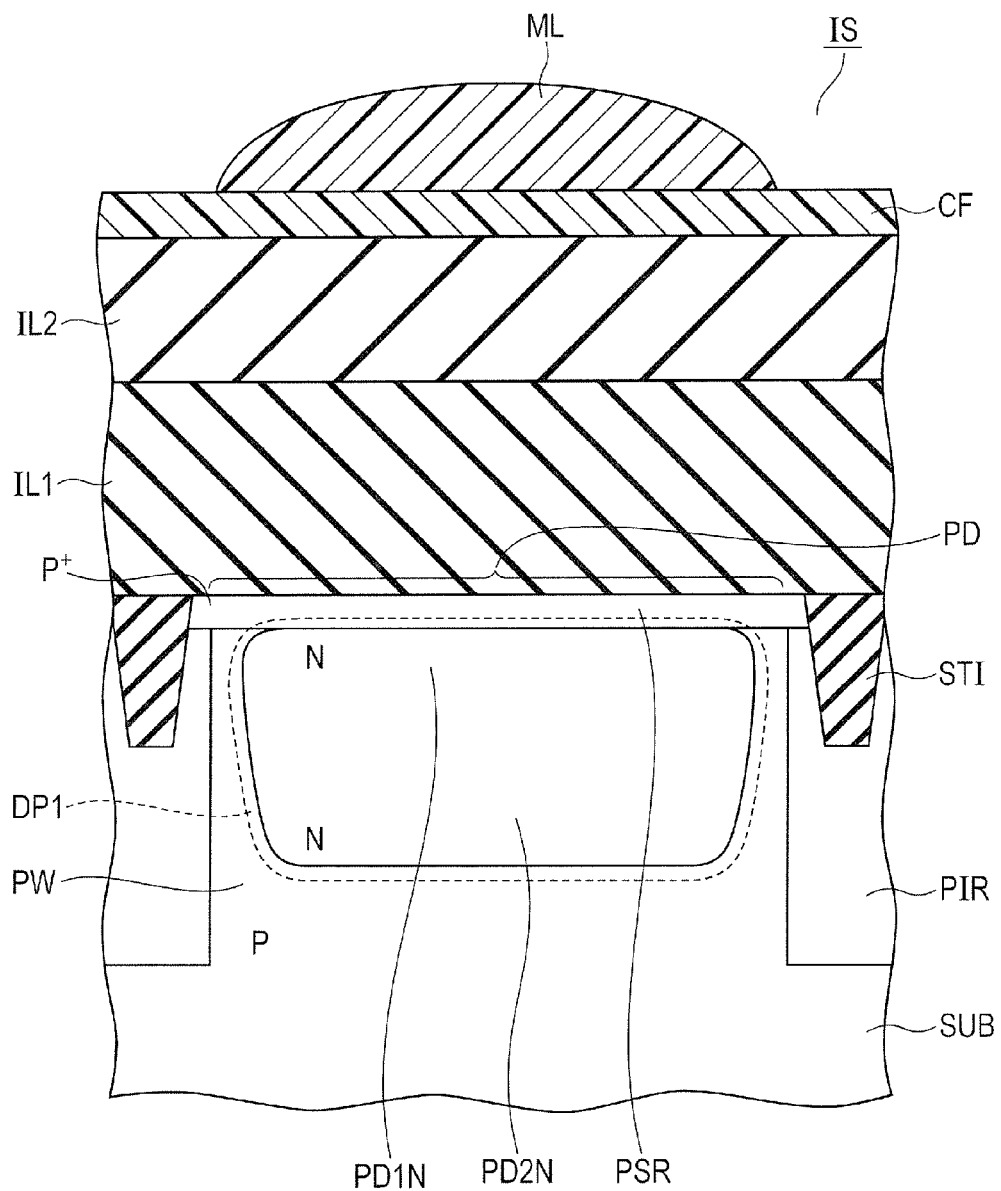
FIG. 24 is a second sectional view showing a depleted state of the photodiode in the same embodiment.
Figure 25:
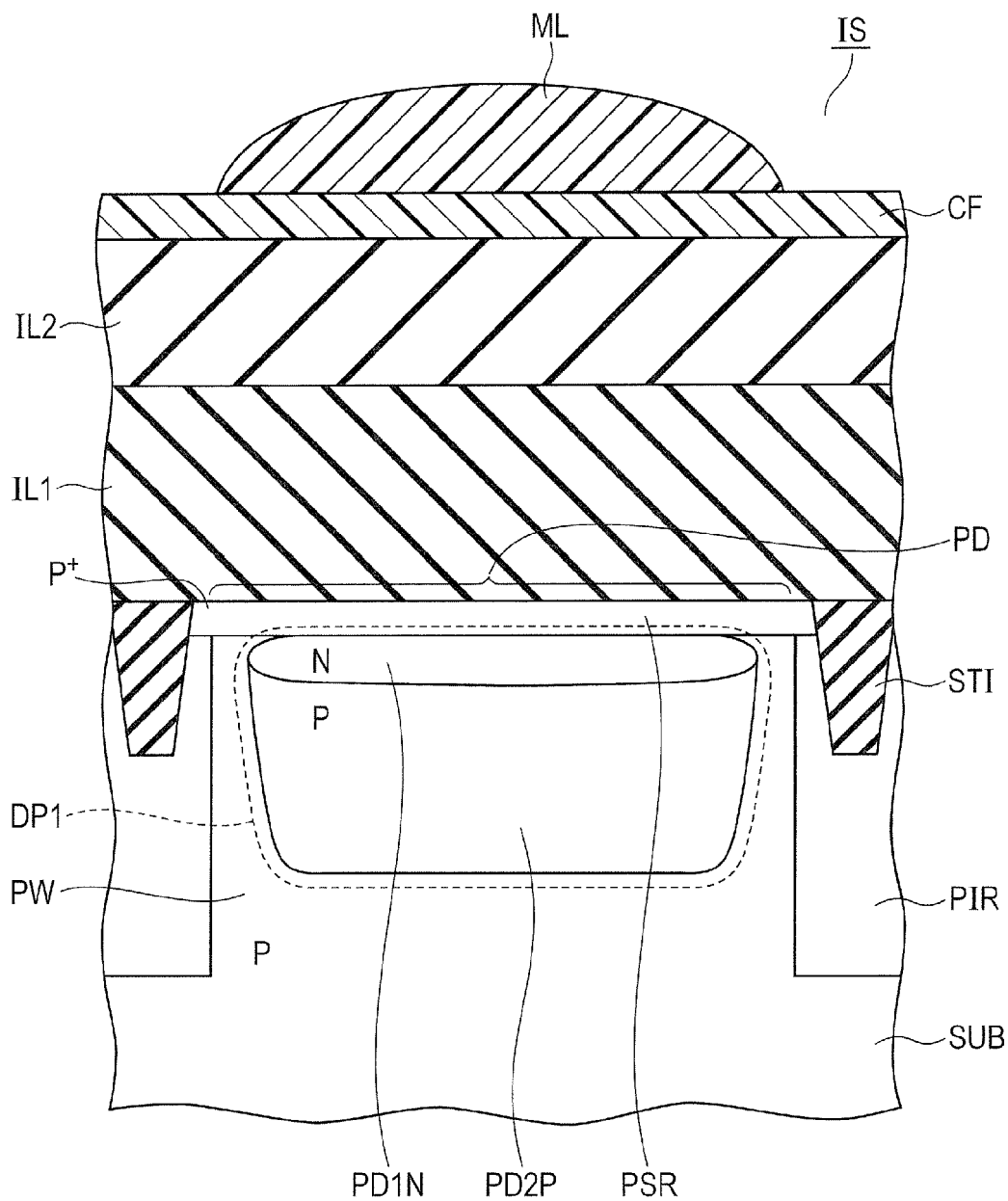
FIG. 25 is a third sectional view showing a depleted state of the photodiode in the same embodiment.
Figure 26:
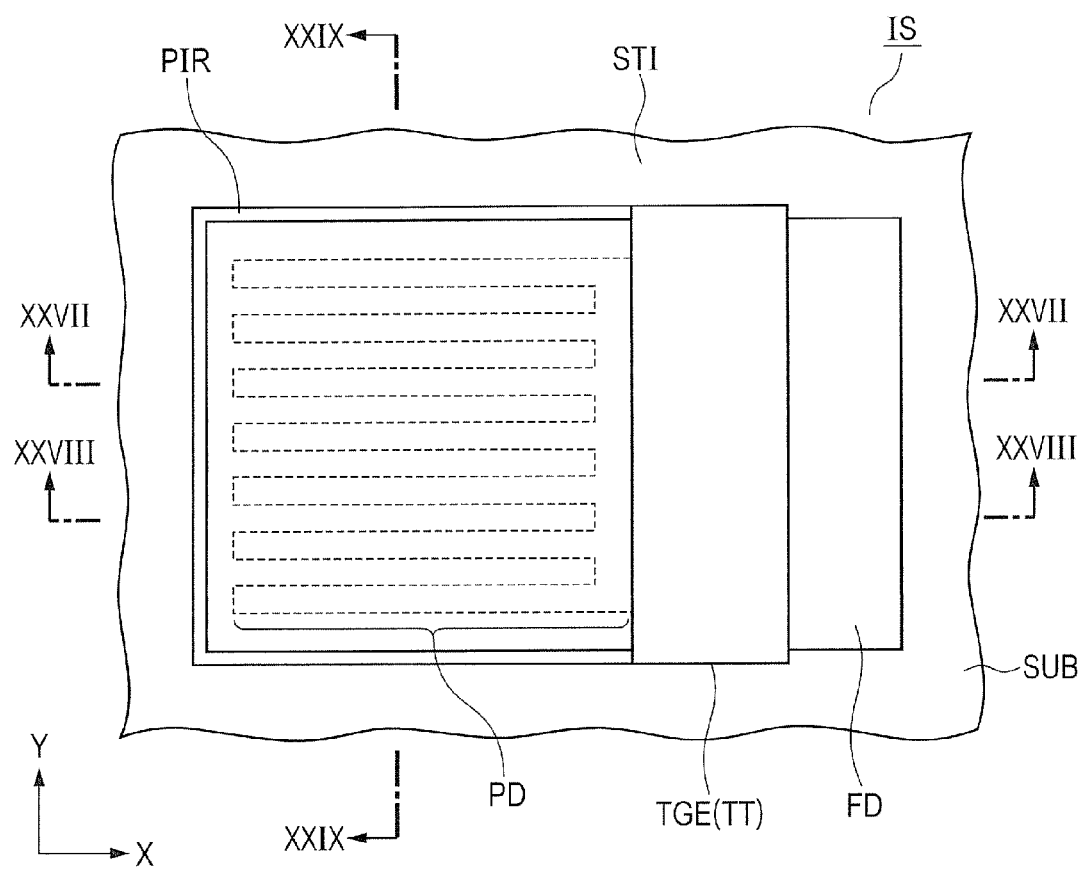
FIG. 26 is a plan view showing an area with a photodiode formed therein and its neighboring areas in an imaging device according to a second embodiment.

Further, each of the junction surfaces between the N-type impurity regions PD2N and the P-type impurity regions PD2P is located in the depth direction (vertical direction). More specifically, the junction surface is located so as to intersect substantially perpendicularly with the surface of the P-type well PW. Thus, the depletion layer extends in the horizontal direction (positive and negative sides in the X direction) from each of the junction surfaces, and the depletion layer end DP1 can be arranged at a deeper position as shown in FIGS. 23, 24, and 25 in the state in which the N-type impurity regions PD2N and the P-type impurity regions PD2P are depleted inclusive of the N-type impurity region PD1N.

As a result, the width (length in a depth direction) of the depletion layer becomes long as compared with the imaging device CIS according to the comparative example, which is formed with only the N-type impurity region CPDN, and electrons generated at a relatively deep position of the area in which the photodiode PD is formed can be collected efficiently, thus making it possible to improve the sensitivity as for the imaging device.

Thus, in the above-described imaging device IS, since the N-type impurity regions PD2N and the P-type impurity regions PD2P are formed in the form of having the junction surfaces in the depth direction, both the capacity (number of saturation electrons) and the sensitivity (collection efficiency of photoelectrons) can be improved.

Incidentally, the value of the impurity concentration and the value of the width, both of which are described above, are illustrated by way of example, but they are not limited to these values.

Second Embodiment

The first embodiment has described the case where the N-type impurity regions PD2N and the P-type impurity regions PD2P respectively having the predetermined width extend in the Y direction. A description will now be made about a case where the N-type impurity regions PD2N and the P-type impurity regions PD2P extend in the X direction.

As shown in FIGS. 26, 27, 28, and 29, in an imaging device IS, a P-type impurity region PSR (impurity concentration: about $1 \times 10^{18}/cm^3$ or more) is formed from the surface of a semiconductor substrate SUB (P-type well PW) to a predetermine depth in an area in which a photodiode PD in the P-type well PW is formed.

An N-type impurity region PDN (impurity concentration: about $2 \times 10^{17}/cm^3$ or so) is formed from the lower part of the P-type impurity region PSR to a deeper position so as to contact the P-type impurity region PSR. Further, a P-type impurity region PDP (impurity concentration: about $4 \times 10^{17}/cm^3$ or so) is formed from the lower part of the P-type impurity region PSR to a deeper position so as to be in contact with the P-type impurity region PSR. Incidentally, each impurity concentration taken herein is one example. It is also assumed that the relation of magnitude between the impurity concentrations is reversed.

Figure 3:
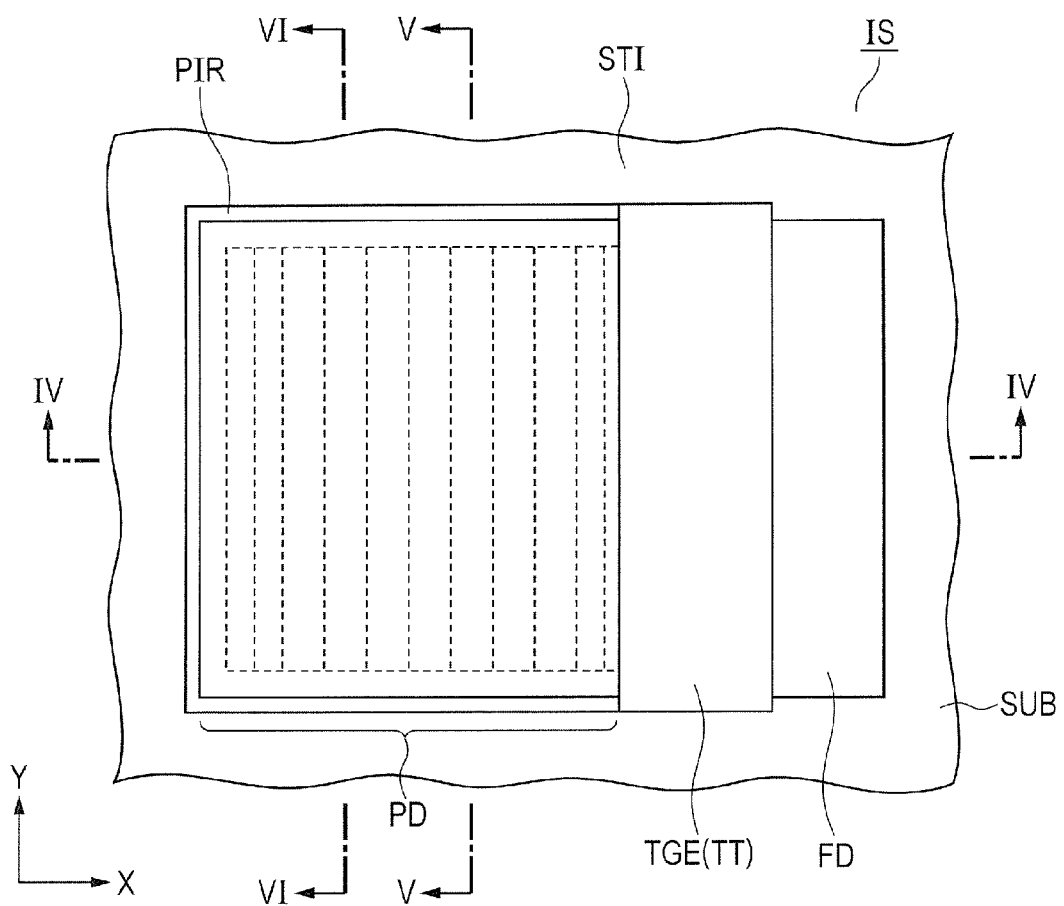
FIG. 3 is a plan view showing an area with a photodiode formed therein and its neighboring areas in an imaging device according to a first embodiment.

The N-type impurity region PDN extends in the X direction with a depth (about 0.1 μm or so), and the P-type impurity region PDP extends in the X direction with a width (about 0.05 μm or so). The N-type impurity region PDN and the P-type impurity region PDP are alternately arranged in a plural form along the Y direction in the form in which they are in contact with each other. That is, the junction surface between the N-type impurity region PDN and the P-type impurity region PDP is positioned (in a depth direction) so as to be substantially orthogonal to the surface of the semiconductor substrate SUB (P-type well PW) and positioned in a gate length direction (X direction). Incidentally, since the present imaging device IS is similar to the imaging device IS shown in FIG. 3 and the like in terms of configurations other than the above, the same reference numerals are attached to the same members, and their description will not be repeated except for where required.

Figure 30:
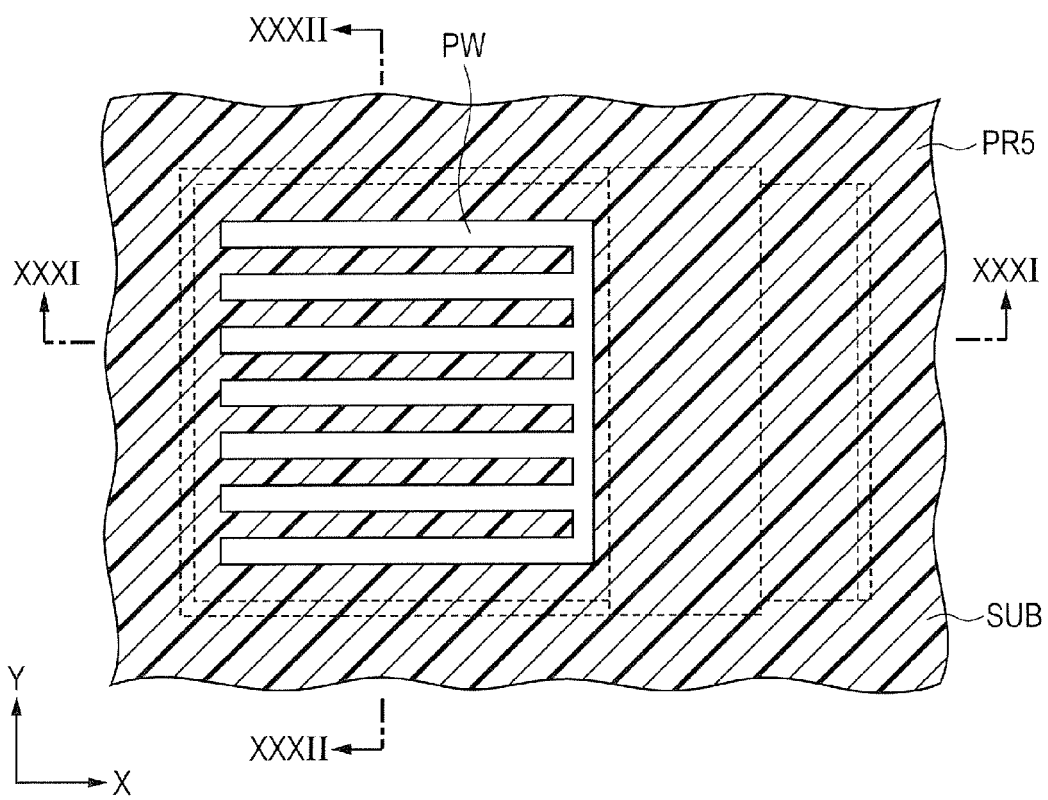
FIG. 30 is a plan view showing one step of a manufacturing method of the imaging device in the same embodiment.
Figure 31:
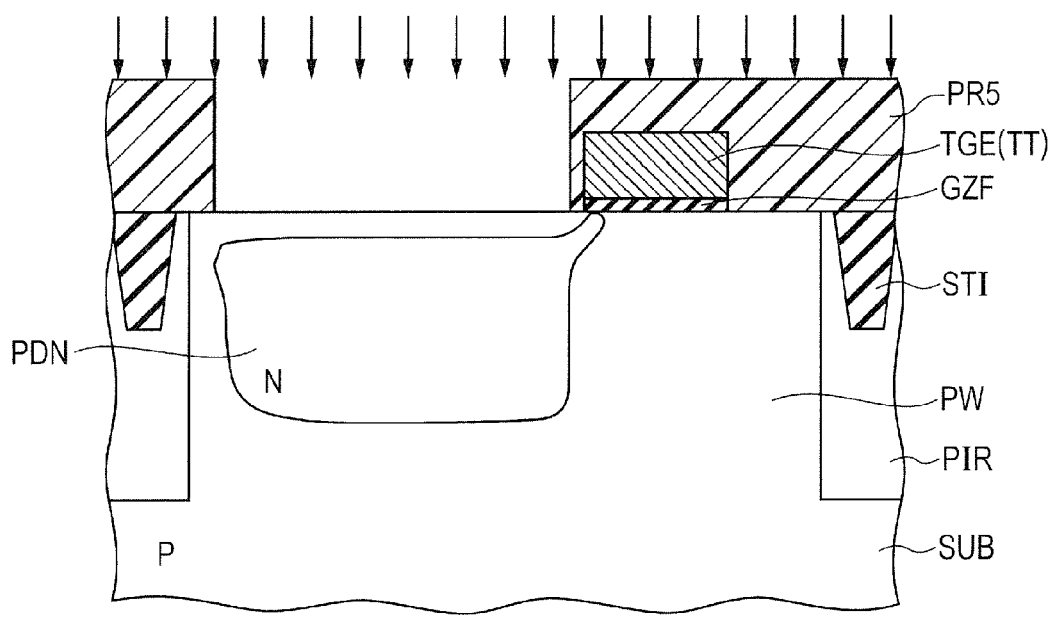
FIG. 31 is a sectional view showing a step performed after the step shown in FIG. 30, which is taken along a sectional line corresponding to a sectional line XXXI-XXXI shown in FIG. 30 in the same embodiment.
Figure 32:
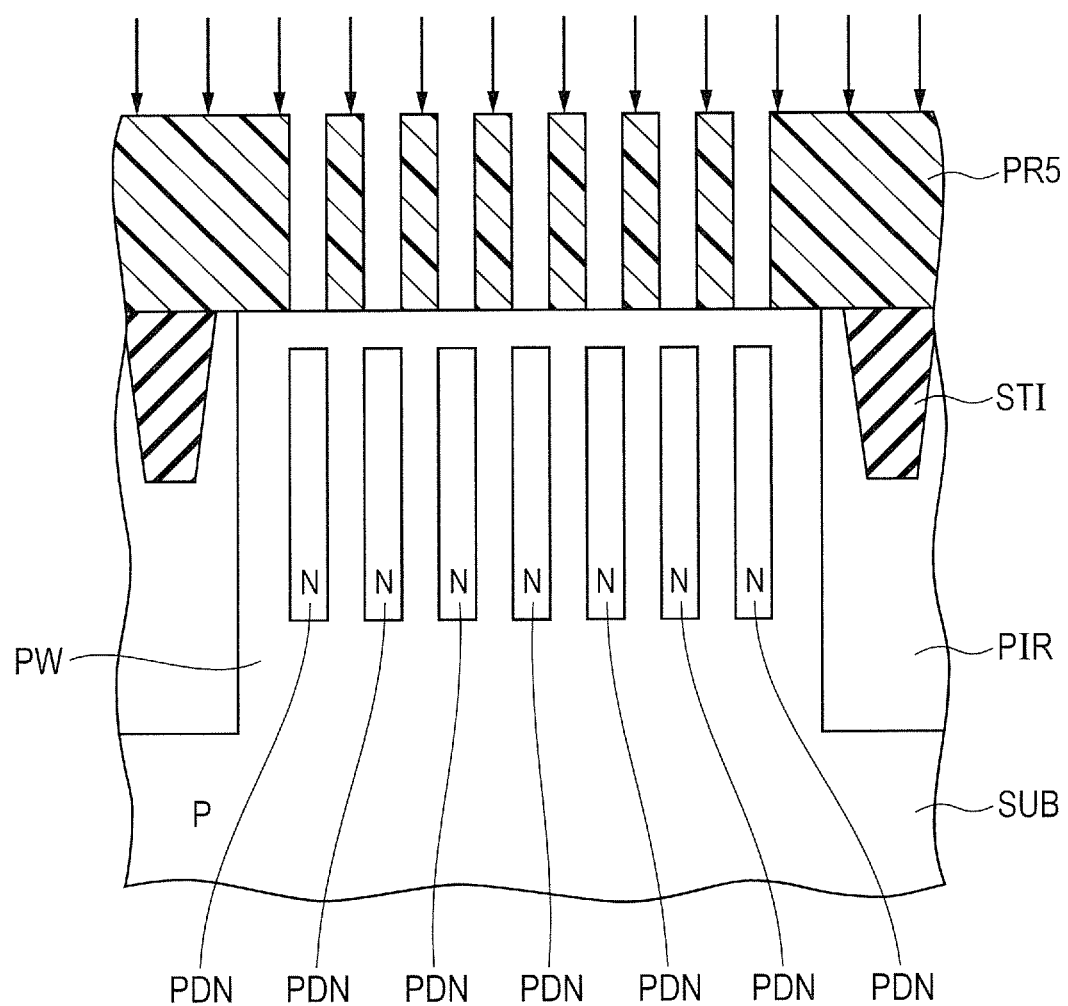
FIG. 32 is a sectional view in the step shown in FIG. 31, which is taken along a sectional line corresponding to a sectional line XXXII-XXXII shown in FIG. 30 in the same embodiment.

A description will next be made about one example of a manufacturing method of the above-described imaging device IS. After the step shown in FIG. 7 described above, a predetermined photoengraving process is performed as shown in FIG. 30 to thereby form a photoresist pattern PR5. Opening patterns each having a width in a Y direction and extending in an X direction are formed in the photoresist pattern PR5. Next, as shown in FIGS. 31 and 32, an N-type impurity is implanted with relatively high implantation energy with the photoresist pattern PR5 as an implantation mask to thereby form an N-type impurity region PDN. Further, an N-type impurity is implanted obliquely into the surface of the semiconductor substrate SUB (P-type well PW), so that an N-type impurity region PDN is formed up to a region immediately below a side wall portion of a gate electrode TGE. Thereafter, the photoresist pattern PR5 is removed.

Figure 33:
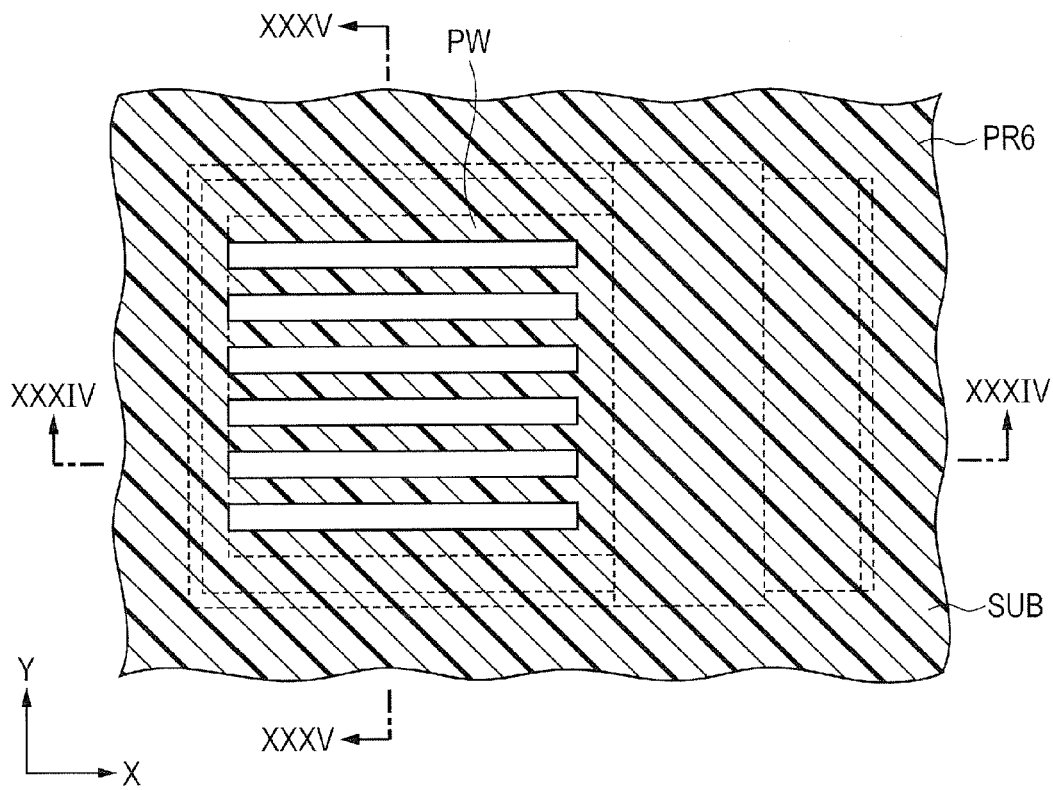
FIG. 33 is a plan view showing a step performed after the step shown in FIGS. 31 and 32 in the same embodiment.
Figure 34:
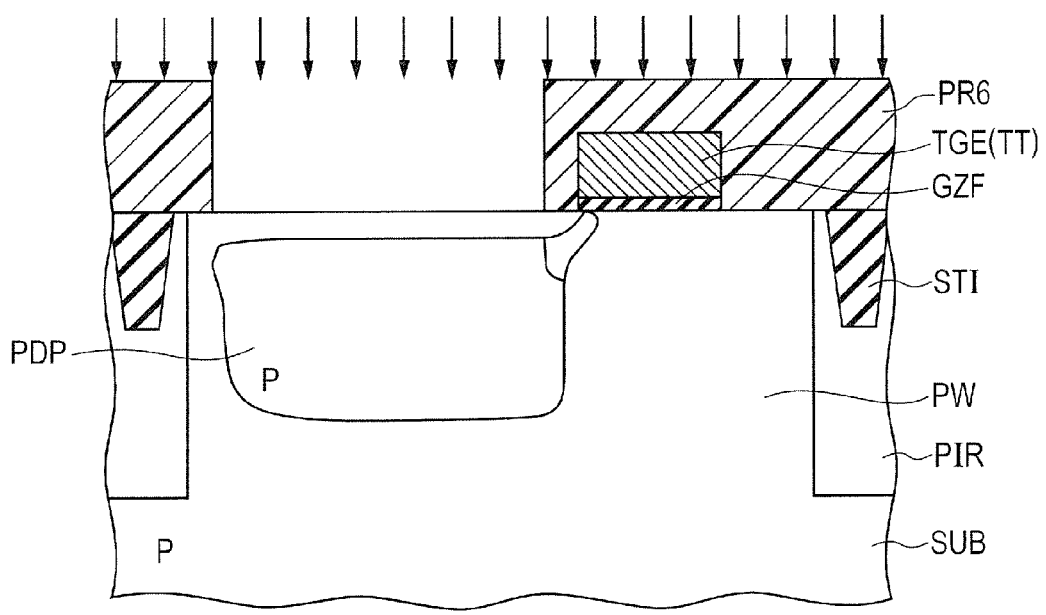
FIG. 34 is a sectional view showing a step performed after the step shown in FIG. 33, which is taken along a sectional line corresponding to a sectional line XXXIV-XXXIV shown in FIG. 33 in the same embodiment.
Figure 35:
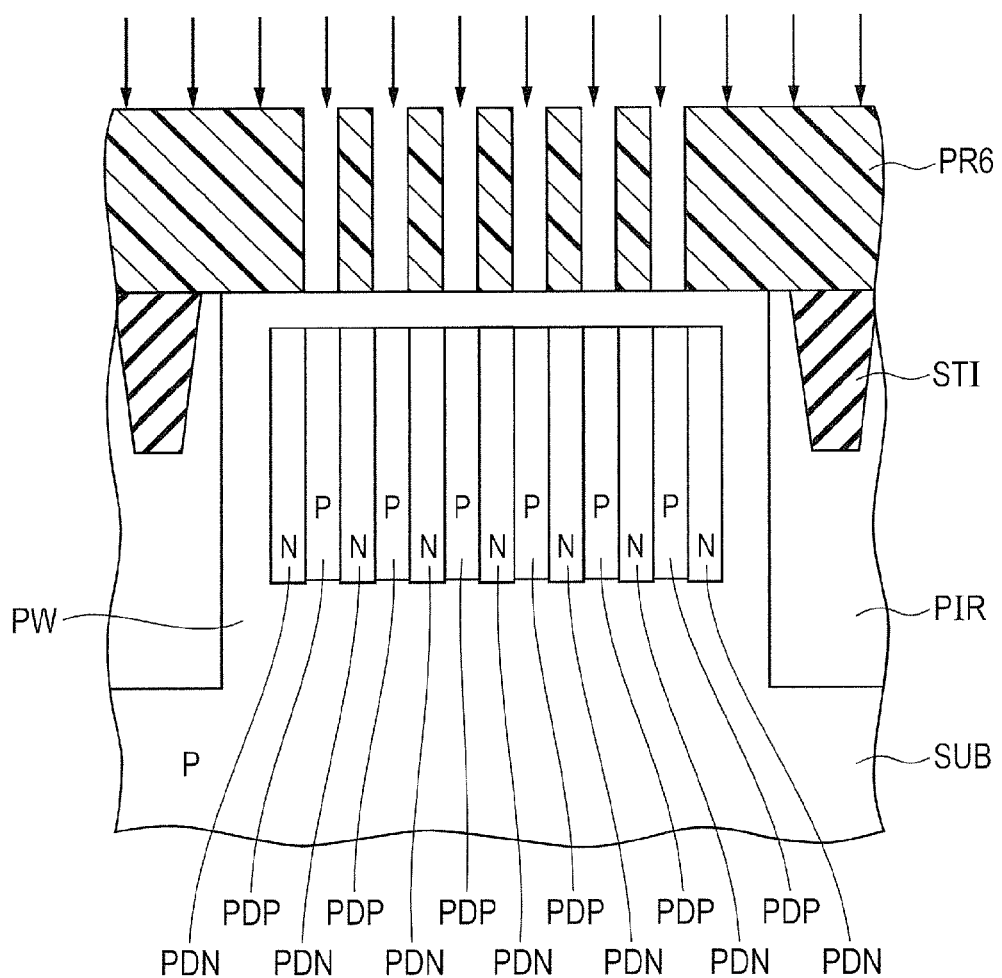
FIG. 35 is a sectional view in the step shown in FIG. 34, which is taken along a sectional line corresponding to a sectional line XXXV-XXXV shown in FIG. 33 in the same embodiment.

Next, as shown in FIG. 33, a predetermined photoengraving process is performed to thereby form a photoresist pattern PR6. Opening patterns each having a width in the Y direction and extending in the X direction are formed in the photoresist pattern PR6. Next, as shown in FIGS. 34 and 35, a P-type impurity is implanted with relatively high implantation energy with the photoresist pattern PR6 as an implantation mask to thereby form a P-type impurity region PDP. Thereafter, the photoresist pattern PR6 is removed.

Figure 27:
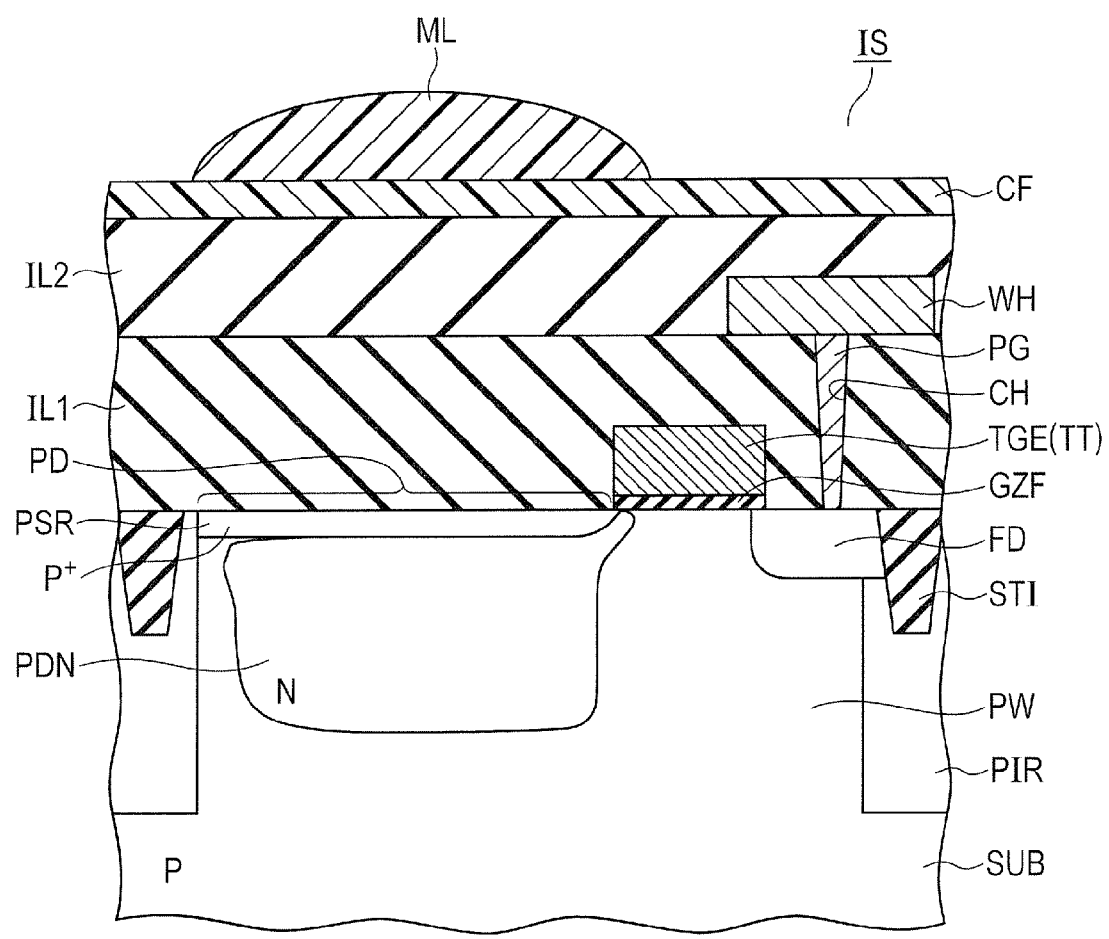
FIG. 27 is a sectional view taken along a sectional line XXVII-XXVII shown in FIG. 26 in the same embodiment.
Figure 28:
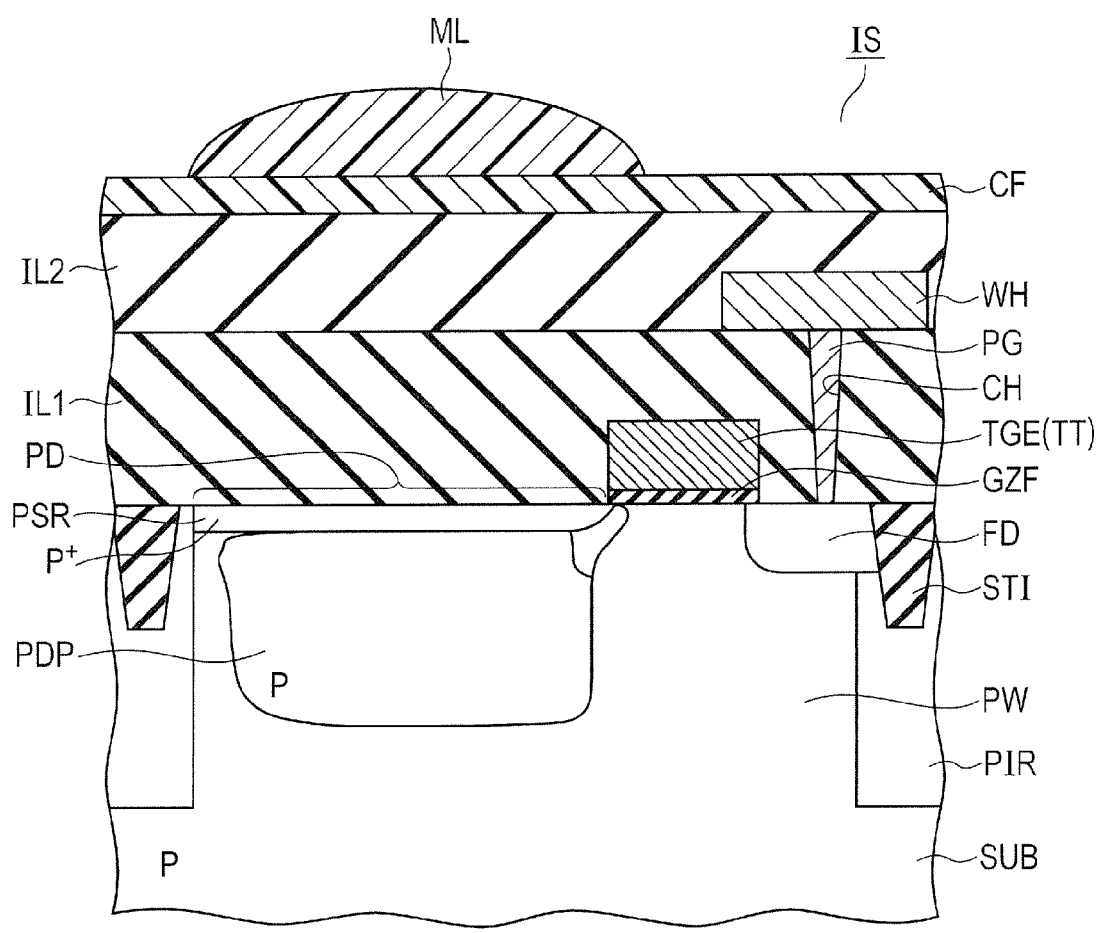
FIG. 28 is a sectional view taken along a sectional line XXVIII-XXVIII shown in FIG. 26 in the same embodiment.
Figure 29:
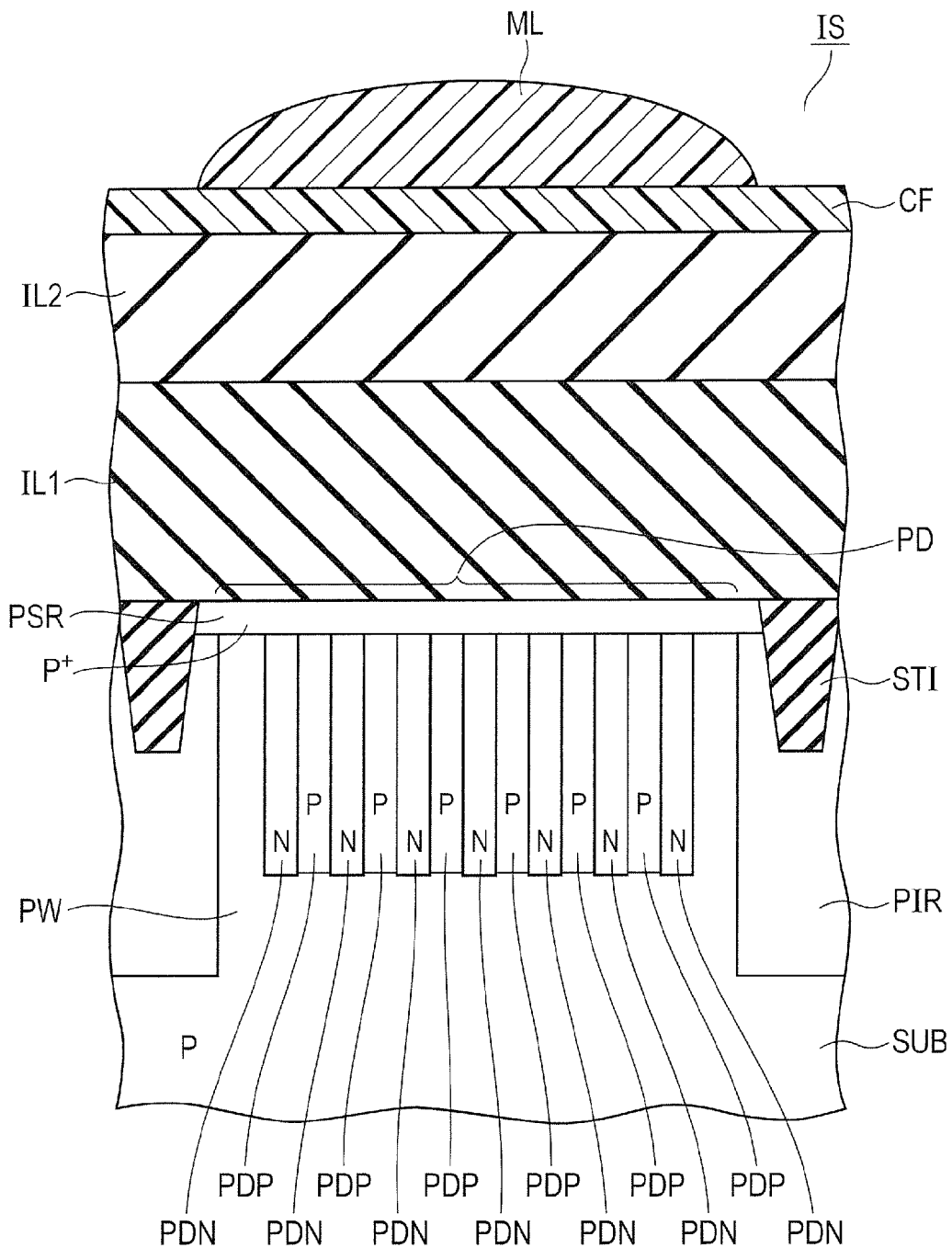
FIG. 29 is a sectional view taken along a sectional line XXIX-XXIX shown in FIG. 26 in the same embodiment.
Figure 36:
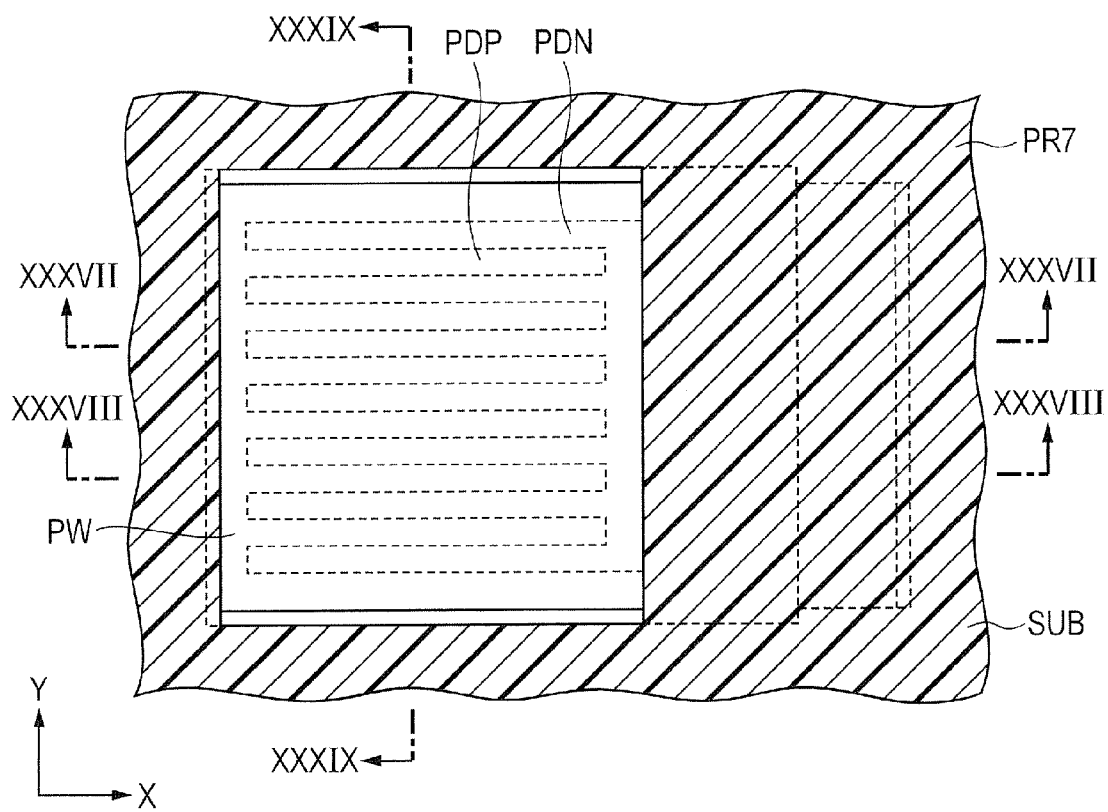
FIG. 36 is a plan view showing a step performed after the step shown in FIGS. 34 and 35 in the same embodiment.
Figure 37:
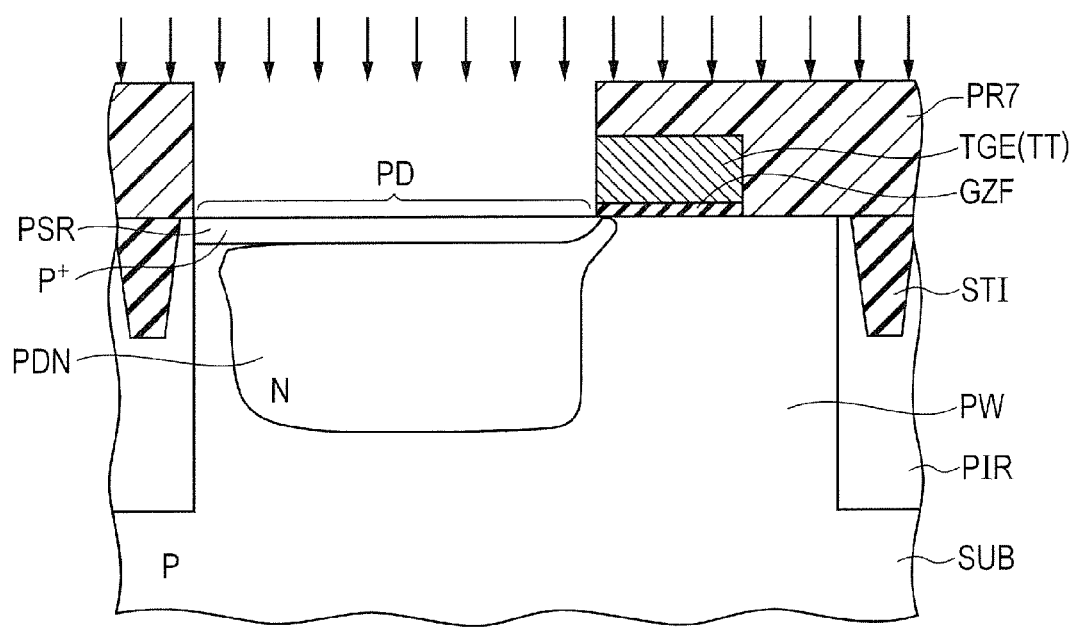
FIG. 37 is a sectional view showing a step performed after the step shown in FIG. 36, which is taken along a sectional line corresponding to a sectional line XXXVII-XXXVII shown in FIG. 36 in the same embodiment.
Figure 38:
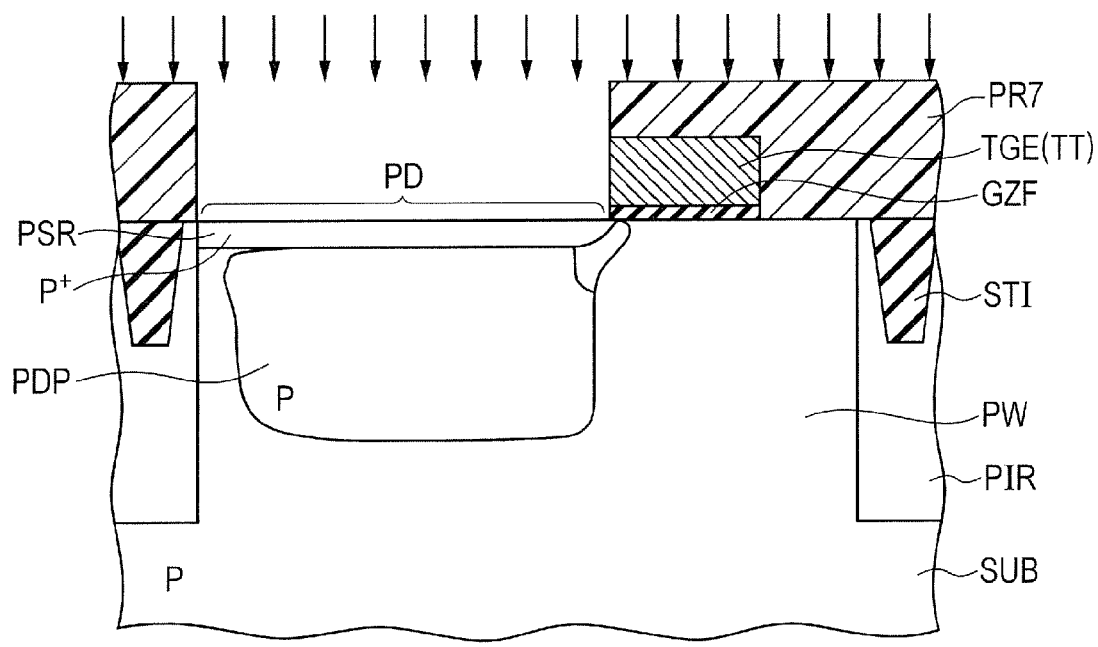
FIG. 38 is a sectional view in the step shown in FIG. 37, which is taken along a sectional line corresponding to a sectional line XXXVIII-XXXVIII shown in FIG. 36 in the same embodiment.
Figure 39:
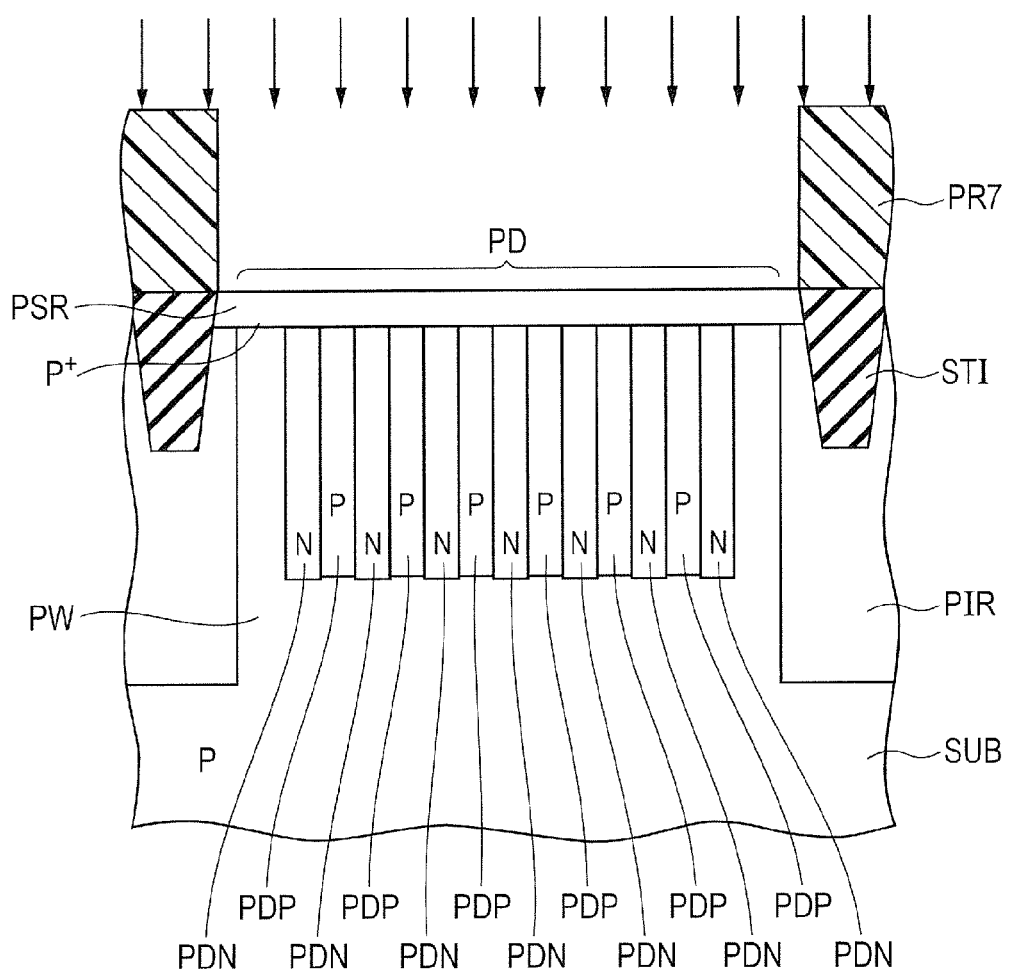
FIG. 39 is a sectional view in the step shown in FIG. 37, which is taken along a sectional line corresponding to a sectional line XXXIX-XXXIX shown in FIG. 36 in the same embodiment.

Next, as shown in FIG. 36, a predetermined photoengraving process is performed to thereby expose an area of the P-type well PW in which the photodiode is formed and form a photoresist pattern PR7 which covers other areas. Next, as shown in FIGS. 37, 38, and 39, a P-type impurity is implanted with the photoresist pattern PR7 as an implantation mask to thereby form a P-type impurity region PSR. After the P-type impurity region PSR is formed, the photoresist pattern PR7 is removed. Thereafter, the principal part of the imaging device IS shown in FIGS. 27 and 28 and the like is completed through steps similar to the step shown in FIG. 16 and the step shown in FIG. 17.

In the above-described semiconductor device, a plurality of N-type impurity regions PDN and a plurality of P-type impurity regions PDP are respectively formed from the lower part of the P-type impurity region PSR to a deeper position. Further, the impurity concentration of each of the N-type impurity regions PDN and the P-type impurity regions PDP is set higher than that of the P-type well PW. As a result, the capacity (number of saturation electrons) of the photodiode PD can be increased as compared with the imaging device CIS (refer to FIGS. 18 and 19) according to the comparative example.

Further, the N-type impurity regions PDN are respectively formed with a predetermined width (for example, $X_N$). Furthermore, the P-type impurity regions PDP are also respectively formed with a predetermined width (for example, $X_P$). Thus, when the photodiode PD is depleted, a depletion layer end extending from one junction surface and a depletion layer end extending from the other junction surface are depleted with being coupled to each other in each of the N-type impurity regions PDN. Further, a depletion layer end extending from one junction surface and a depletion layer end extending from the other junction surface are depleted with being coupled to each other even in each of the P-type impurity regions PDP.

Figure 40:
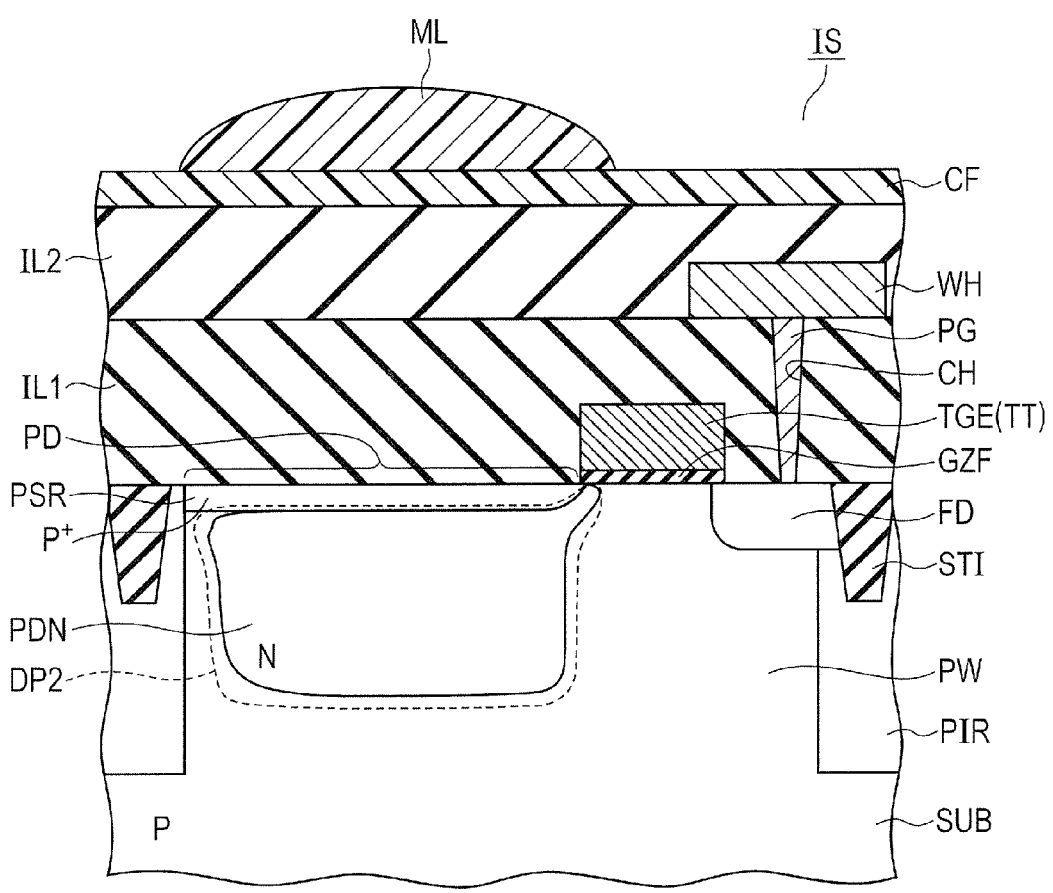
FIG. 40 is a first sectional view showing a depleted state of the photodiode in the same embodiment.
Figure 41:
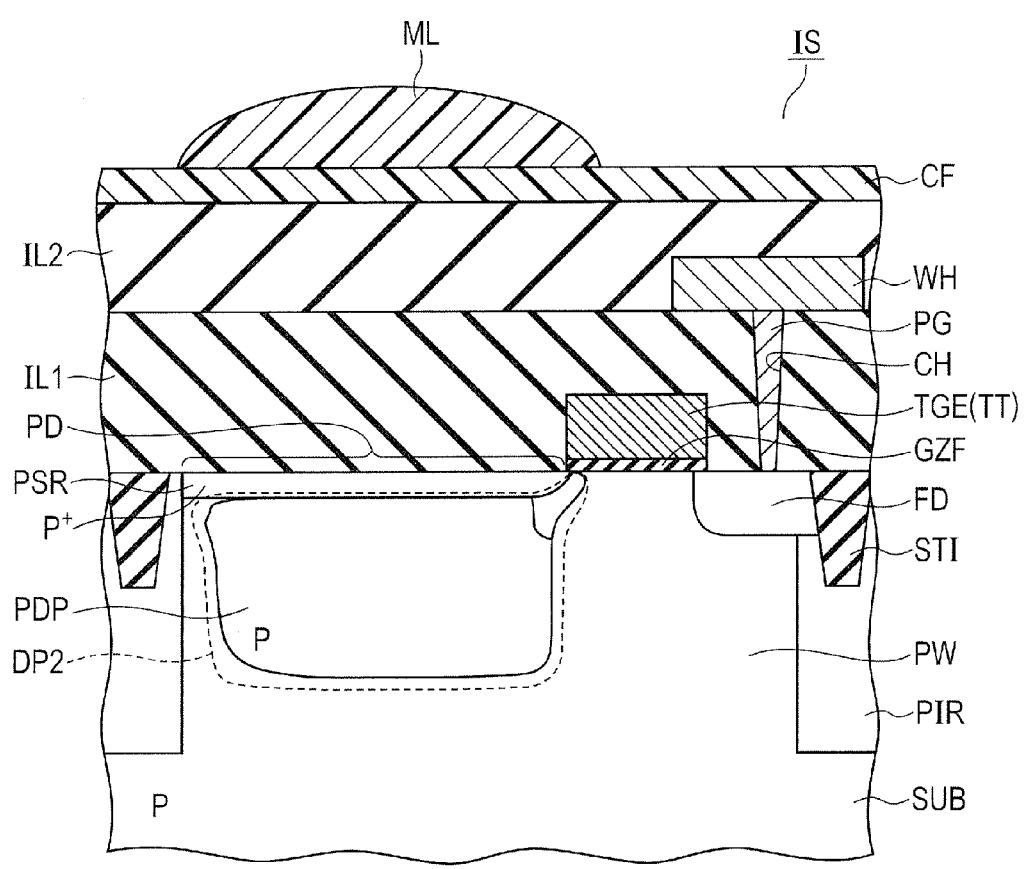
FIG. 41 is a second sectional view showing the depleted state of the photodiode in the same embodiment.
Figure 42:
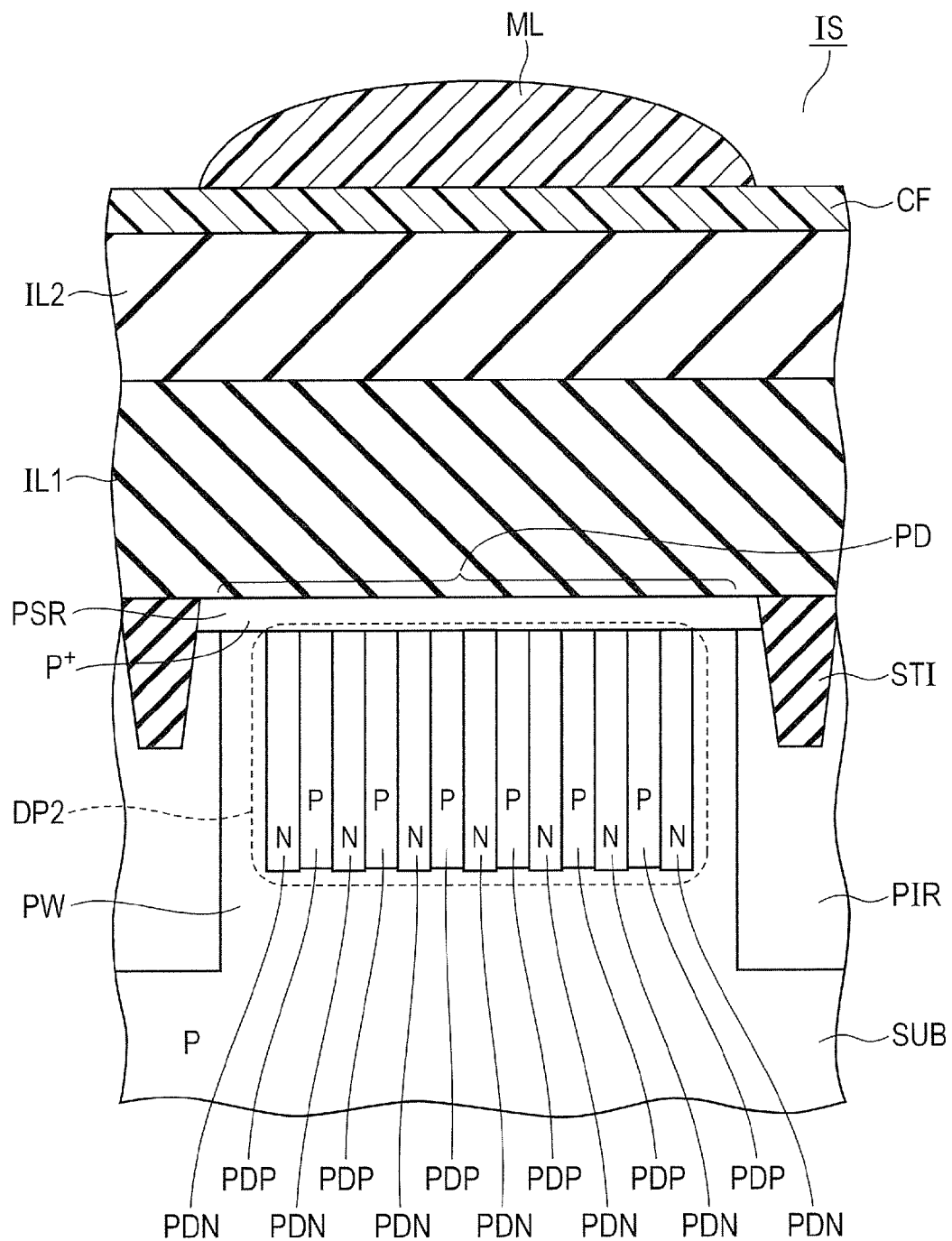
FIG. 42 is a third sectional view showing the depleted state of the photodiode in the same embodiment.

Further, each of the junction surfaces between the N-type impurity regions PDN and the P-type impurity regions PDP is located in a depth direction (vertical direction). More specifically, the junction surface is located so as to intersect substantially perpendicularly with the surface of the P-type well PW. Thus, a depletion layer end DP2 can be arranged at a deeper position as shown in FIGS. 40, 41, and 42 in a state in which a depletion layer extends in the horizontal direction (positive and negative sides in the Y direction) from each of the junction surfaces, and the N-type impurity regions PDN and the P-type impurity regions PDP are depleted.

As a result, the width (length in the depth direction) of the depletion layer becomes long as compared with the imaging device CIS (refer to FIGS. 18 and 19) according to the comparative example, and electrons generated at a relatively deep position of the area in which the photodiode PD is formed can be collected efficiently, thus making it possible to improve the sensitivity as for the imaging device.

Thus, in the above-described imaging device IS, since the N-type impurity regions PDN and the P-type impurity regions PDP are formed in the form of having the junction surfaces in the depth direction, both the capacity (number of saturation electrons) and the sensitivity (collection efficiency of photoelectrons) can be improved.

Further, in the above-described imaging device IS, the N-type impurity regions PDN and the P-type impurity regions PDP can respectively be arranged up to the area located immediately below the side portion of the gate electrode TGE by arranging the junction surfaces between the N-type impurity regions PDN and the P-type impurity regions PDP in the gate length direction. Thus, it is possible to transfer the electric charges generated in the photodiode PD to the floating diffusion region FD without forming the N-type impurity region PD1N (refer to FIG. 4 and the like).

Therefore, as compared with the imaging device IS equipped with the N-type impurity region PD1N (refer to FIG. 4 and the like), the depletion potentials of the N-type impurity regions PDN and the P-type impurity regions PDP are not restricted due to the relationship with the depletion potential ($V_{dep1}$) of the N-type impurity region PD1N. As a result, the degrees of freedom of the respective widths of the N-type impurity regions PDN and the P-type impurity regions PDP, and their impurity concentrations are increased and hence the margin in a manufacturing process can be enlarged.

Incidentally, the value of the impurity concentration and the value of the width, both of which are described above, are illustrated by way of example, but they are not limited to these values.

Third Embodiment

A description will now be made about an imaging device in which N-type impurity regions are formed along an isolation P-type region.

Figure 43:
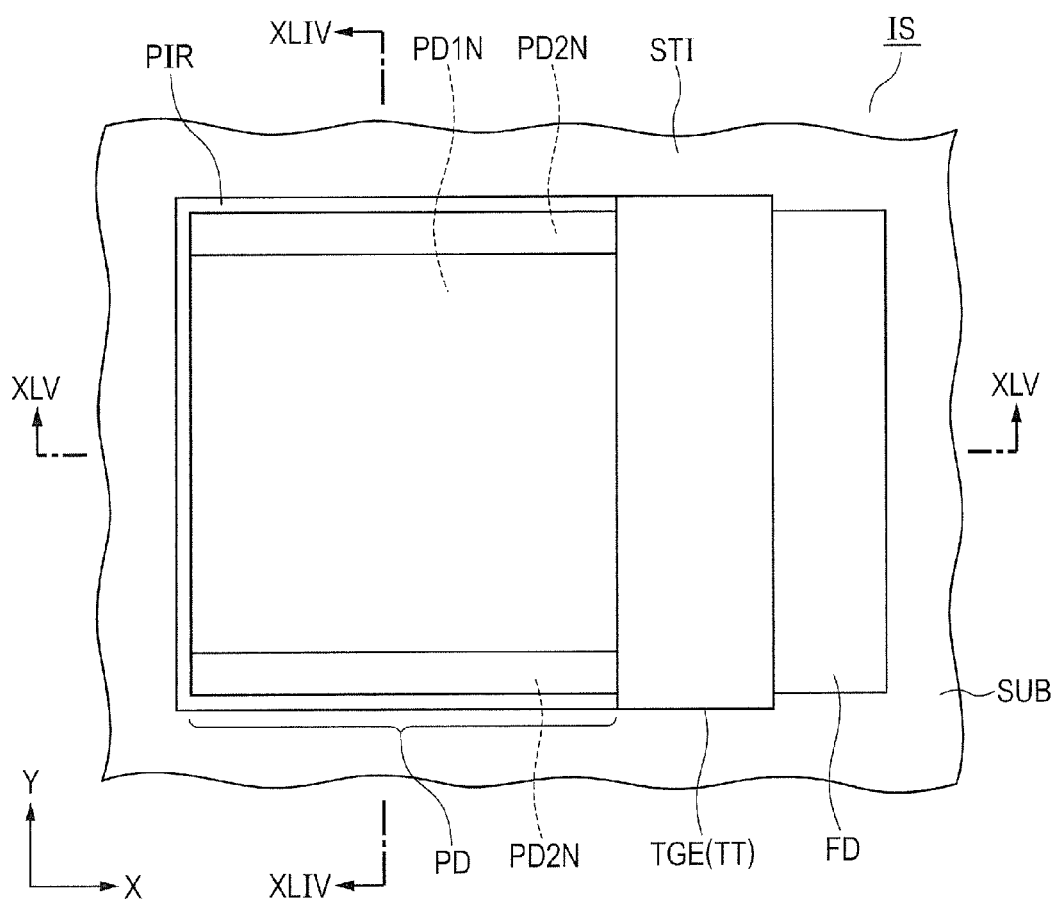
FIG. 43 is a plan view showing an area with a photodiode formed therein and its neighboring areas in an imaging device according to a third embodiment.
Figure 44:
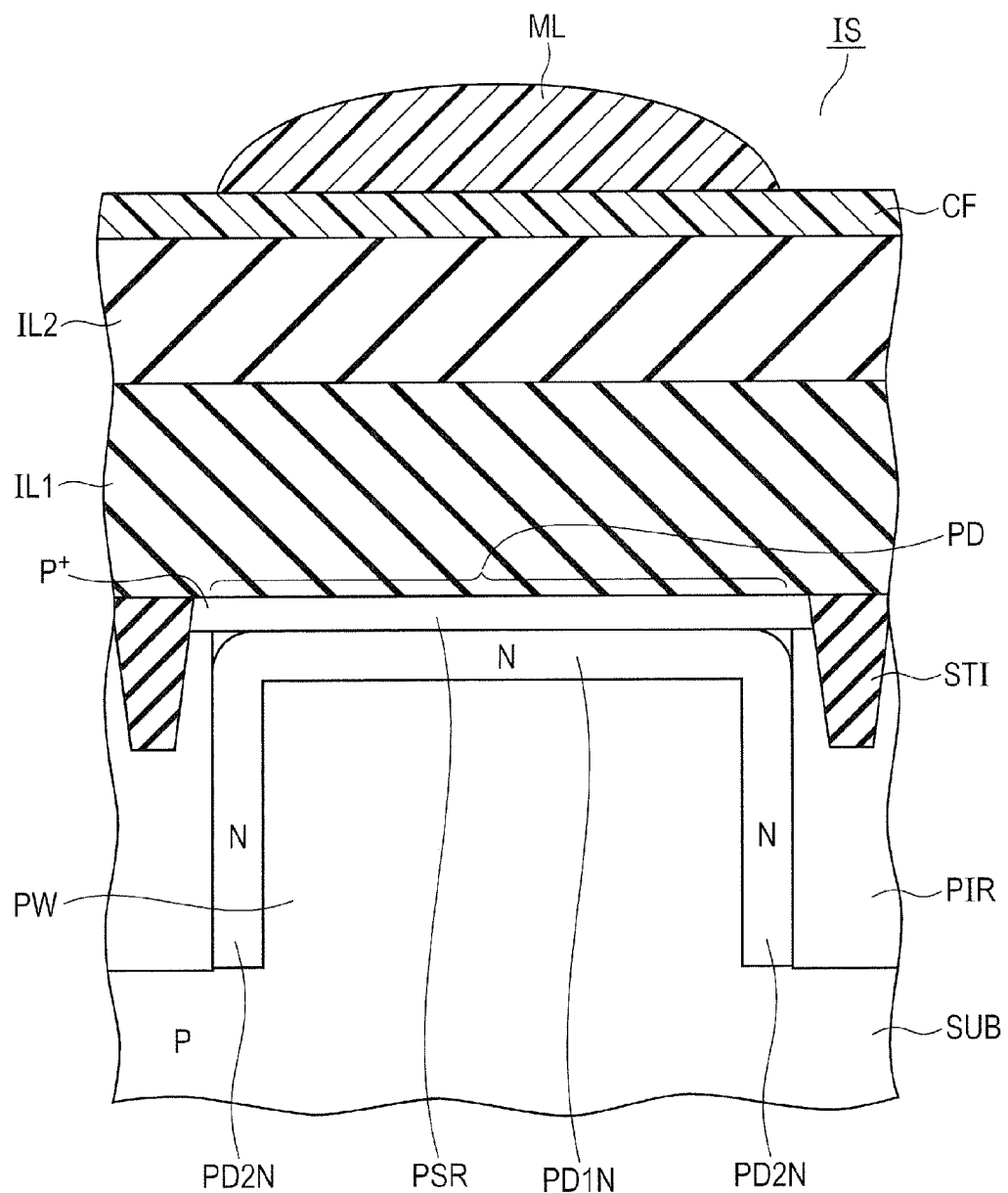
FIG. 44 is a sectional view taken along a sectional line XLIV-XLIV shown in FIG. 43 in the same embodiment.
Figure 45:
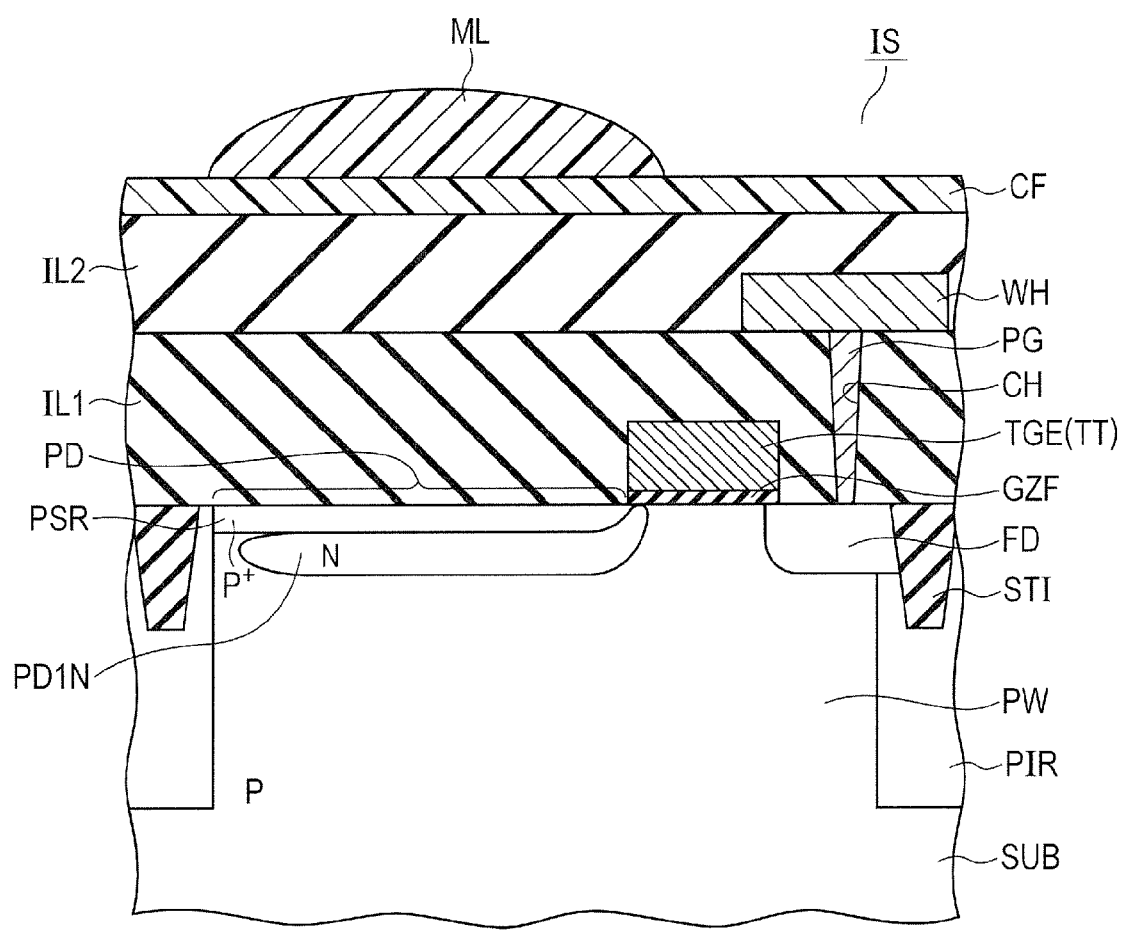
FIG. 45 is a sectional view taken along a sectional line XLV-XLV shown in FIG. 43 in the same embodiment.

As shown in FIGS. 43, 44, and 45, in an imaging device IS, a P-type impurity region PSR (impurity concentration: about $1 \times 10^{18}/cm^3$ or more) is formed from the surface of a semiconductor substrate SUB (P-type well PW) to a predetermine depth in an area in which a photodiode PD in the P-type well PW is formed. An N-type impurity region PD1N (impurity concentration: about $3 \times 10^{17}/cm^3$ or so) is formed from the lower part of the P-type impurity region PSR to a deeper position so as to contact the P-type impurity region PSR.

N-type impurity regions PD2N (impurity concentration: about $2 \times 10^{17}/cm^3$ or so) are formed from the lower part of the N-type impurity region PD1N to a deeper position along an isolation P-type region PIR (impurity concentration: about $1 \times 10^{17 \sim 18}/cm^3$ or so) so as to be in contact with the N-type impurity region PD1N. Each of the N-type impurity regions PD2N is formed so as to extend in an X direction (gate length direction) with a predetermined width.

Incidentally, the N-type impurity region PD2N is not formed along a Y direction (gate width direction). Further, each impurity concentration taken herein is one example. It is also assumed that the relation of magnitude between the impurity concentrations is reversed. Since the present imaging device IS is similar to the imaging device IS shown in FIG. 3 and the like in terms of configurations other than the above, the same reference numerals are attached to the same members, and their description will not be repeated except for where required.

Figure 46:
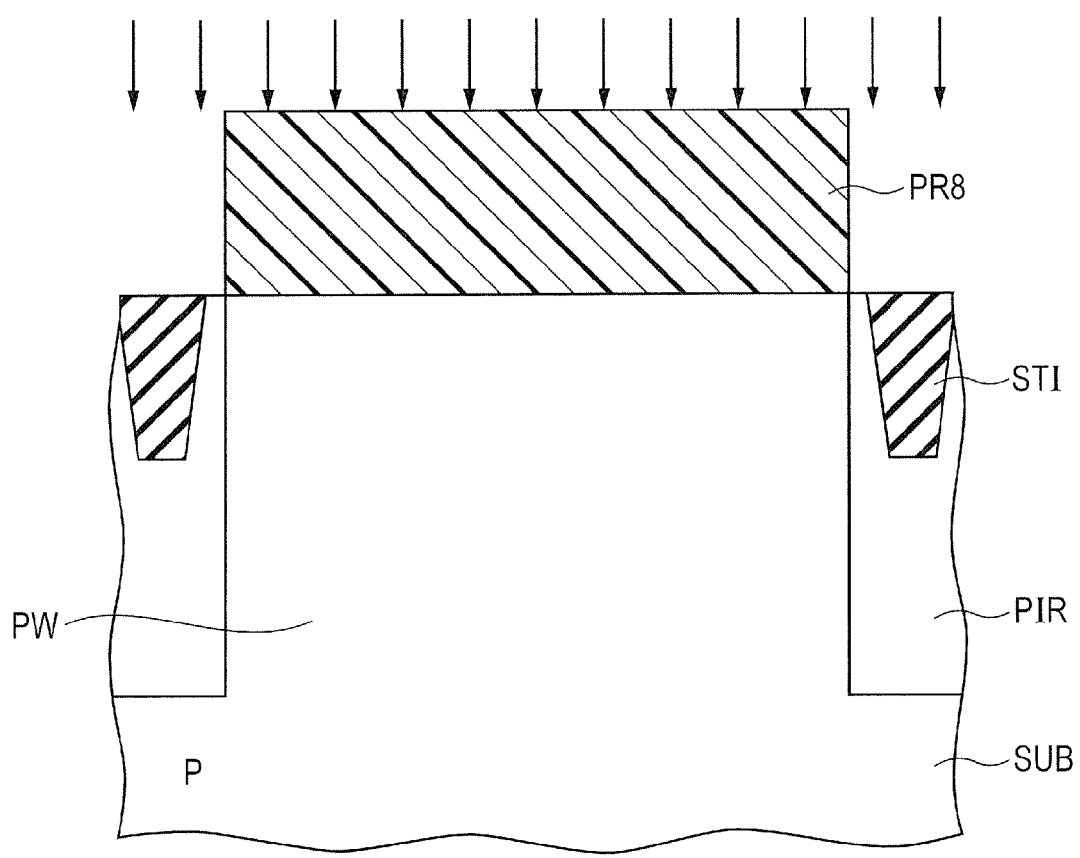
FIG. 46 is a sectional view showing one step of a manufacturing method of the imaging device in the same embodiment.

A description will next be made about one example of a manufacturing method of the above-described imaging device IS. First, as shown in FIG. 46, a predetermined photoengraving process is performed to thereby form a photoresist pattern PR8 which covers the area in which the photodiode PD is formed, and exposes an isolation region. Next, a P-type impurity is implanted with the photoresist pattern PR8 as an implantation mask to thereby form an isolation P-type region PIR from the surface of the semiconductor substrate SUB (P-type well PW) to a predetermined depth. Next, after the photoresist pattern PR8 is removed, a gate electrode TGE (refer to FIG. 45) is formed through a step similar to the step shown in FIG. 7.

Figure 47:
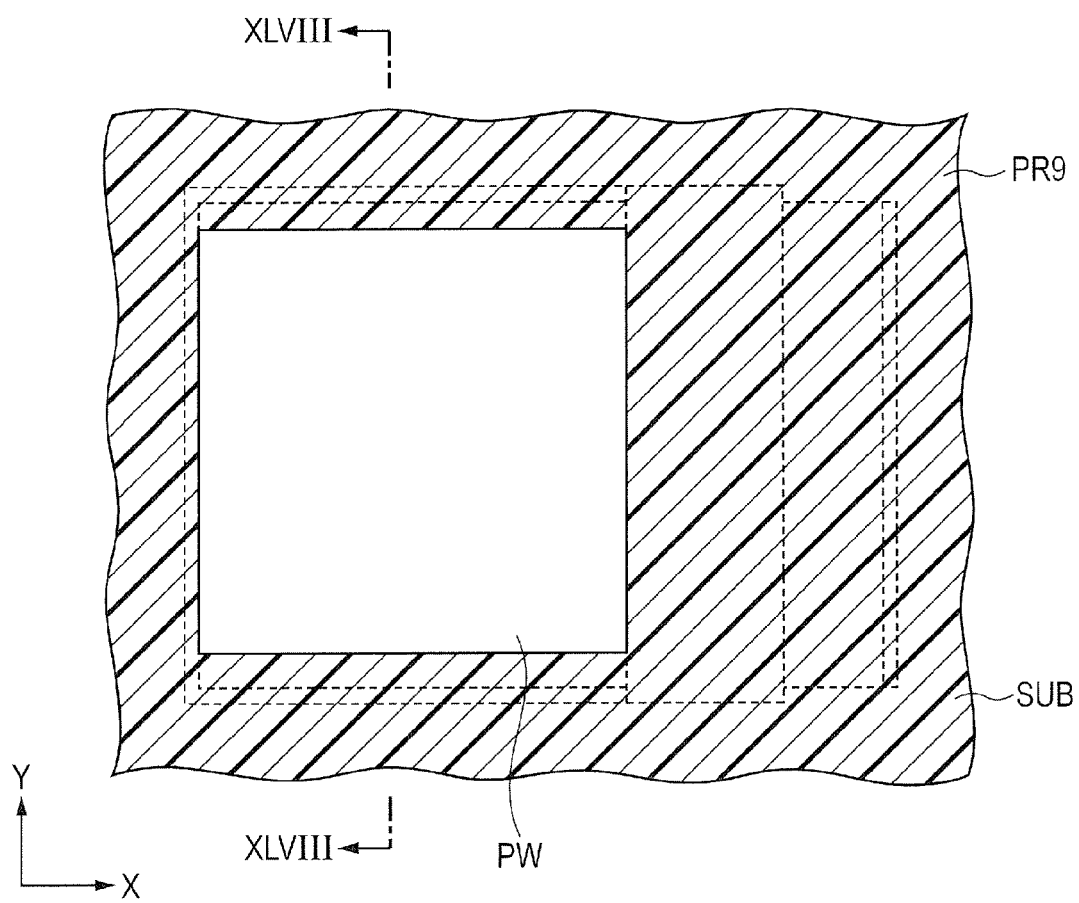
FIG. 47 is a plan view showing a step performed after the step shown in FIG. 46 in the same embodiment.
Figure 48:
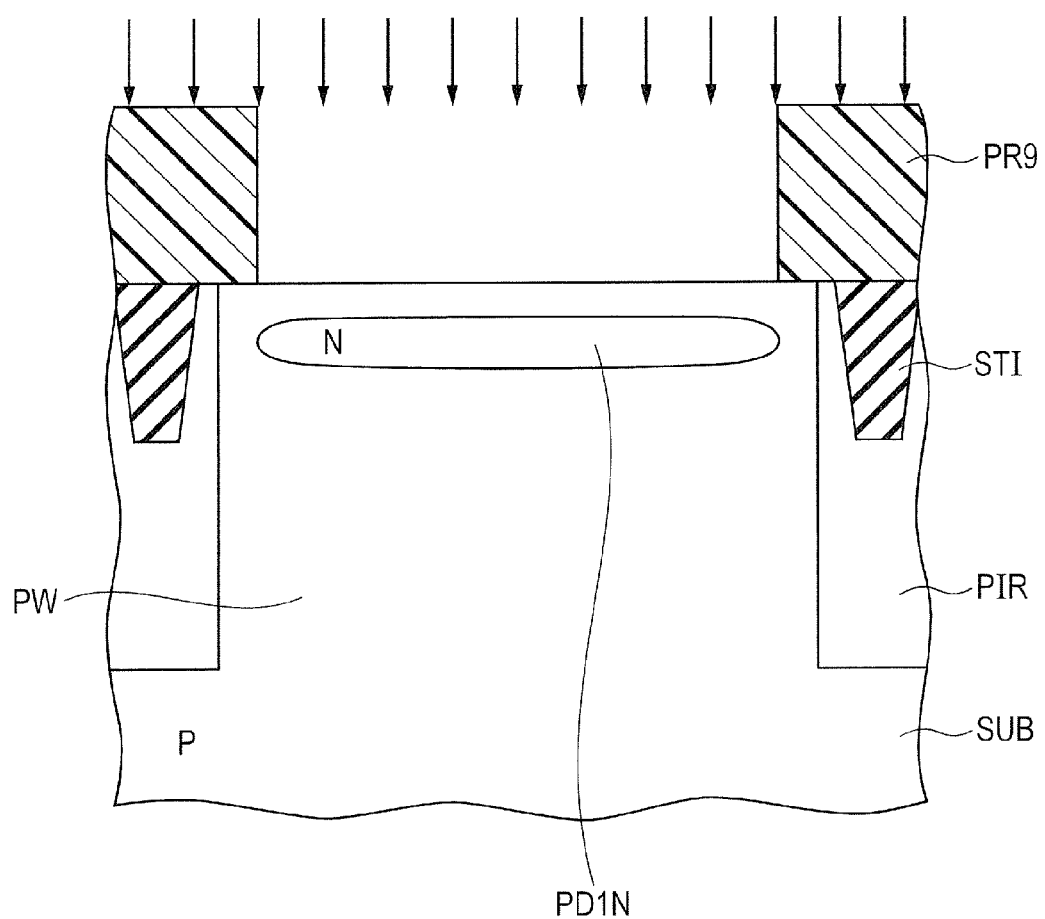
FIG. 48 is a sectional view showing a step performed after the step shown in FIG. 47, which is taken along a sectional line corresponding to a sectional line XLVIII-XLVIII shown in FIG. 47 in the same embodiment.

Next, as shown in FIG. 47, a predetermined photoengraving process is performed to thereby expose an area of the P-type well PW in which the photodiode is formed and form a photoresist pattern PR9 which covers other areas. Next, as shown in FIG. 48, an N-type impurity is implanted with the photoresist pattern PR9 as an implantation mask to thereby form an N-type impurity region PD1N. Thereafter, the photoresist pattern PR9 is removed.

Figure 49:
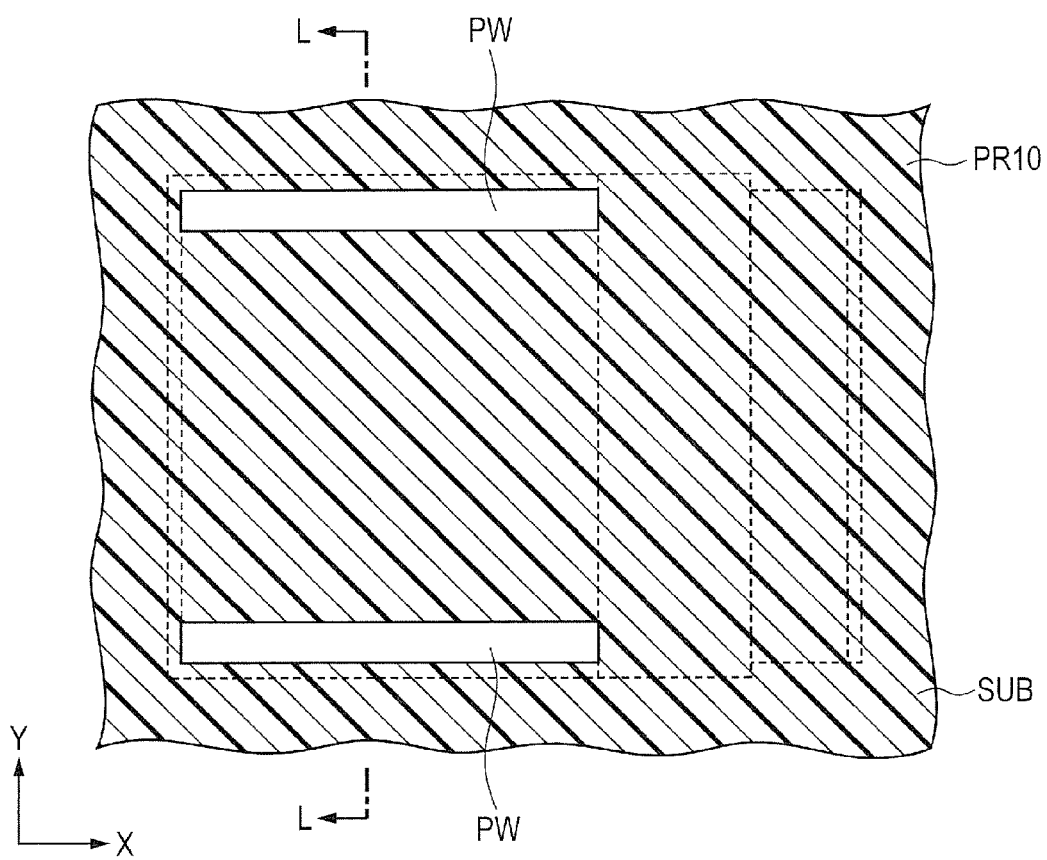
FIG. 49 is a plan view showing a step performed after the step shown in FIG. 48 in the same embodiment.
Figure 50:
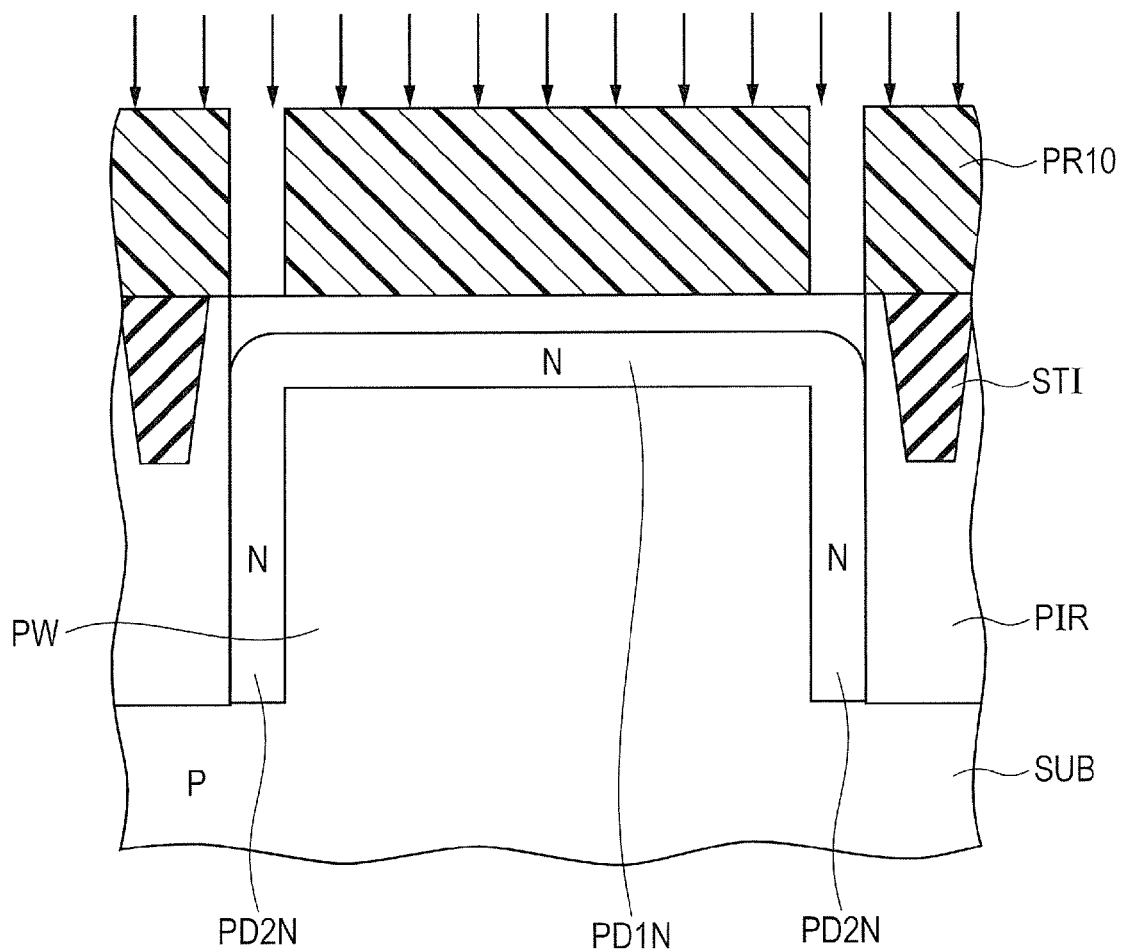
FIG. 50 is a sectional view showing a step performed after the step shown in FIG. 49, which is taken along a sectional line corresponding to a sectional line L-L shown in FIG. 49 in the same embodiment.

Next, as shown in FIG. 49, a predetermined photoengraving process is performed to thereby form a photoresist pattern PR10. Opening patterns each extending in the X direction along the isolation P-type region PIR are respectively formed in the photoresist pattern PR10 with a predetermined width. Next, as shown in FIG. 50, an N-type impurity is implanted with the photoresist pattern PR10 as an implantation mask to thereby form N-type impurity regions PD2N. Thereafter, the photoresist pattern PR10 is removed.

Figure 51:
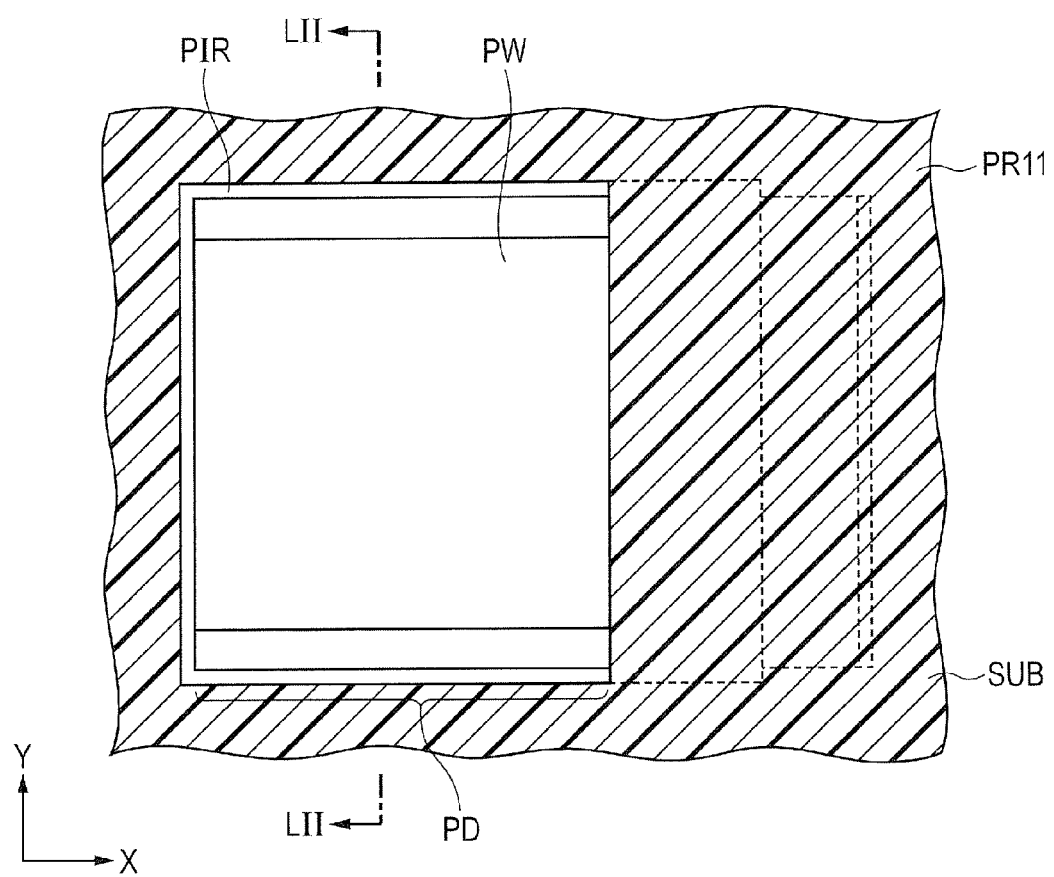
FIG. 51 is a plan view showing a step performed after the step shown in FIG. 50 in the same embodiment.
Figure 52:
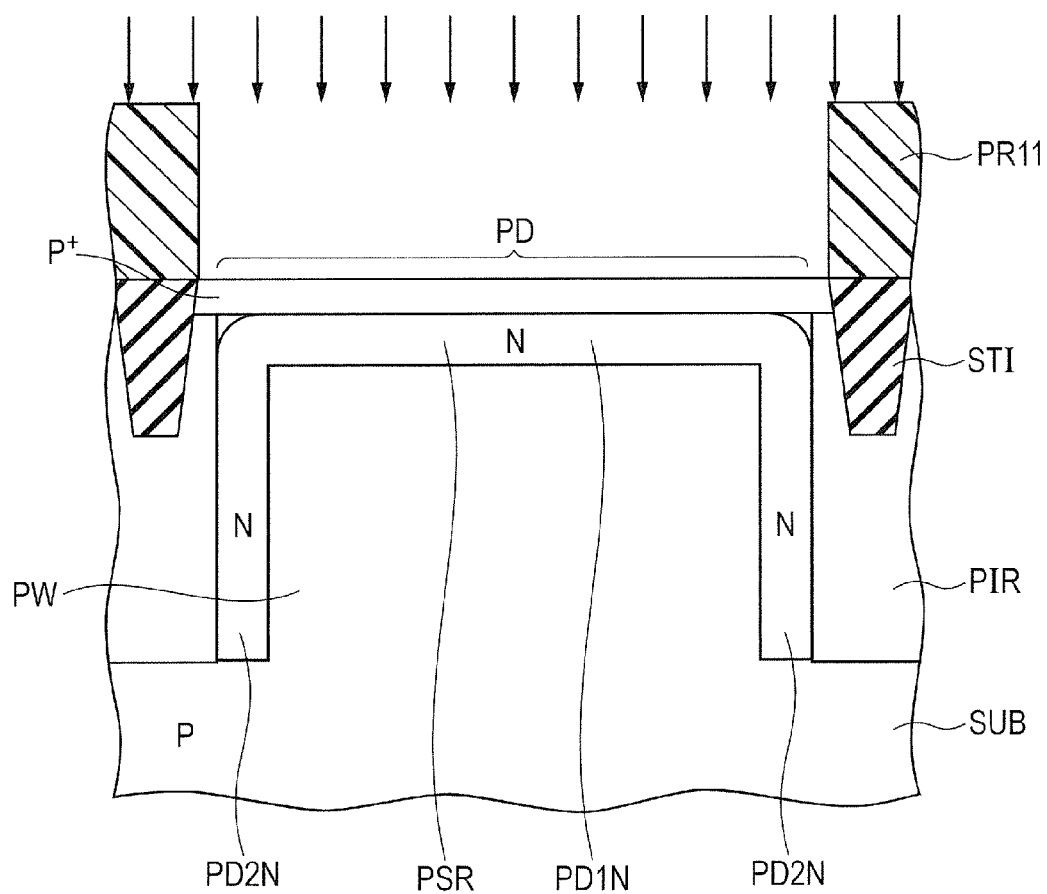
FIG. 52 is a sectional view showing a step performed after the step shown in FIG. 51, which is taken along a sectional line corresponding to a sectional line LII-LII shown in FIG. 51 in the same embodiment.

Next, as shown in FIG. 51, a predetermined photoengraving process is performed to thereby expose an area in which a photodiode is formed and form a photoresist pattern PR11 which covers other areas. Next, as shown in FIG. 52, a P-type impurity is implanted with the photoresist pattern PR11 as an implantation mask to thereby form a P-type impurity region PSR. After the P-type impurity region PSR is formed, the photoresist pattern PR11 is removed. Thereafter, the principal part of the imaging device IS shown in FIGS. 44 and 45 and the like is completed through steps similar to the step shown in FIG. 16 and the step shown in FIG. 17.

In the above-described semiconductor device, the N-type impurity regions PD2N are formed from the lower part of the N-type impurity region PD1N to a deeper position along the isolation P-type region PIR so as to contact the N-type impurity region PD1N. Further, the respective impurity concentrations of the N-type impurity region PD1N and the N-type impurity regions PD2N are respectively set higher than the impurity concentration of the P-type well PW. Further, the impurity concentration of the isolation P-type region PIR with which each N-type impurity region PD2N is in contact, is also set higher than the impurity concentration of the P-type well PW. As a result, the capacity (number of saturation electrons) of the photodiode PD can be increased as compared with the imaging device CIS (refer to FIGS. 18 and 19) according to the comparative example.

Further, the N-type impurity regions PD2N are formed with a predetermined width. Thus, when the photodiode PD is depleted, depletion layer ends extending from a surface (junction surface A) jointed with the isolation P-type region PIR and a surface (junction surface B) jointed with the P-type well PW are depleted with being coupled to each other in the N-type impurity regions PD2N.

Figure 53:
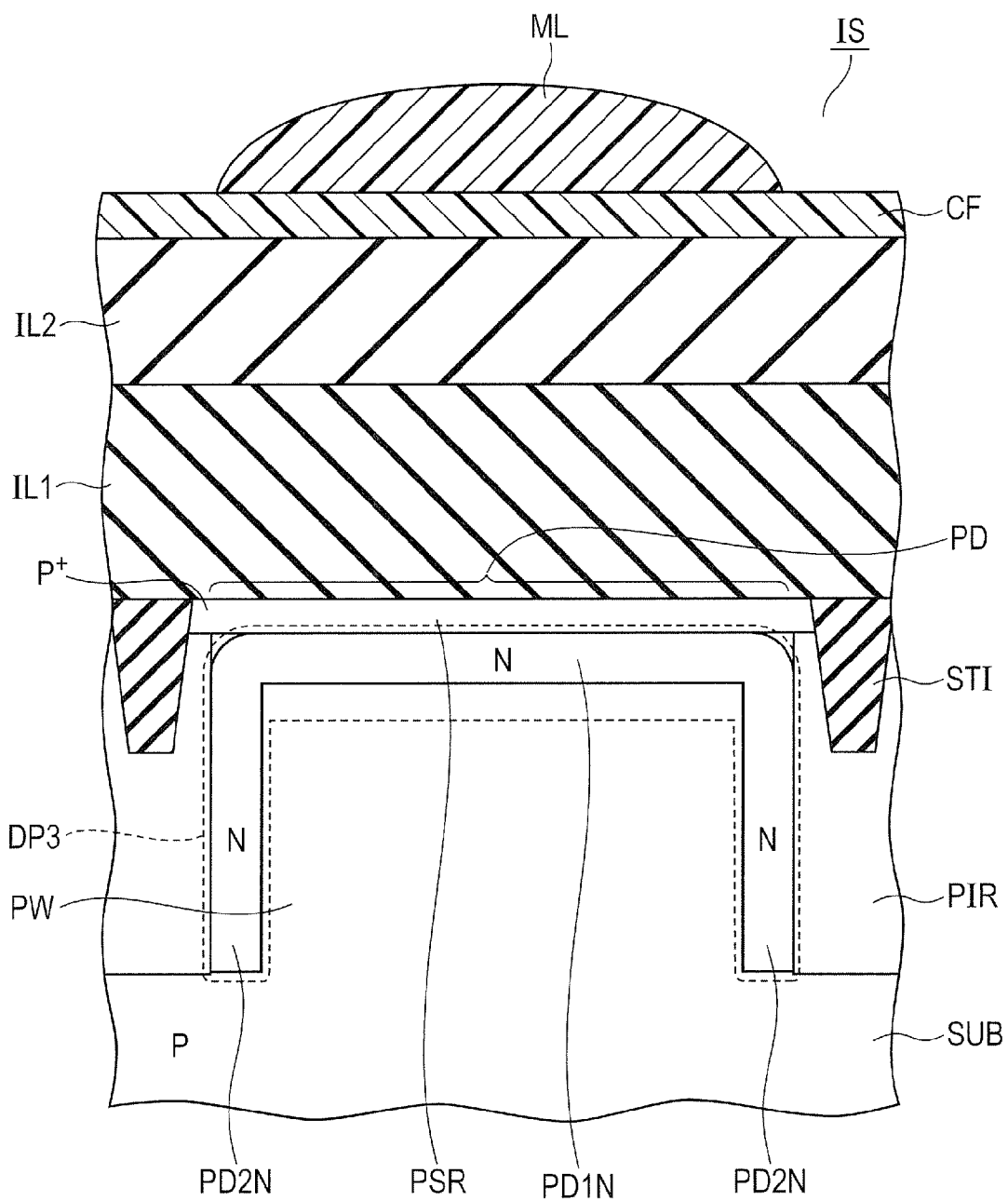
FIG. 53 is a first sectional view showing a depleted state of the photodiode in the same embodiment.
Figure 54:
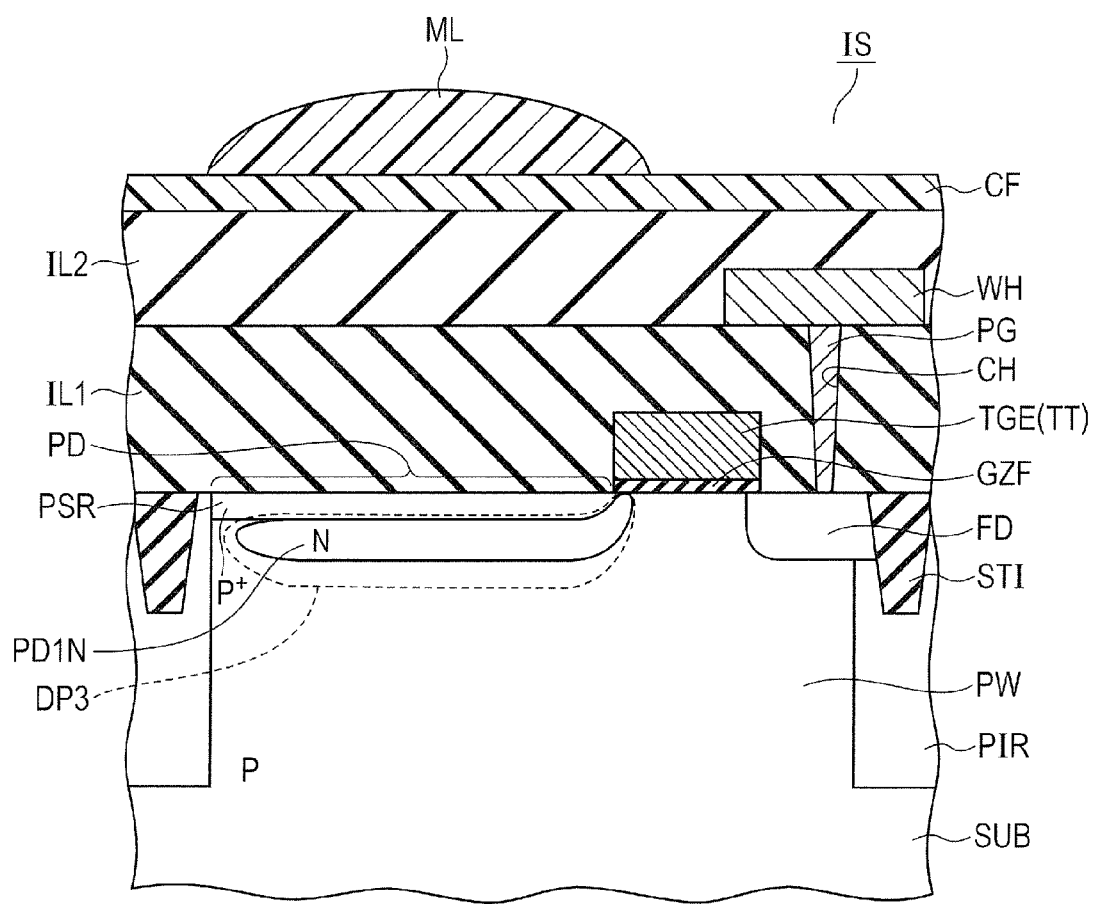
FIG. 54 is a second sectional view showing the depleted state of the photodiode in the same embodiment.

Besides, the junction surface A and the junction surface B are positioned in a depth direction (vertical direction). More specifically, they are positioned so as to intersect substantially perpendicularly with the surface of the P-type well PW. Thus, depletion layer ends DP3 can be arranged at a deeper position as shown in FIGS. 53 and 54 in a state in which the depletion layer extends in the horizontal direction (positive and negative sides in the Y direction) from the junction surface A and the junction surface B, and the N-type impurity regions PD2N are depleted inclusive of the N-type impurity region PD1N.

As a result, the width (length in a depth direction) of the depletion layer becomes long as compared with the imaging device CIS (refer to FIGS. 18 and 19) according to the comparative example, and electrons generated at a relatively deep position of the area in which the photodiode PD is formed can be collected efficiently, thus making it possible to improve the sensitivity as for the imaging device.

Thus, in the above-described imaging device IS, since the N-type impurity regions PD2N are formed in the form of having the junction surfaces in the depth direction, both the capacity (number of saturation electrons) and the sensitivity (collection efficiency of photoelectrons) can be improved.

Further, in the above-described imaging device IS, there is no need to form the P-type impurity regions PD2P and PDP. The photomasks for forming the P-type impurity regions PD2P and PDP can be reduced. of the width, both of which are described above, are illustrated by way of example, but they are not limited to these values. Further, in the imaging devices IS described in the respective embodiments, they can be combined together as needed.

Although the invention made above by the present inventors has been described specifically on the basis of the preferred embodiments, the present invention is not limited to the embodiments referred to above. It is needless to say that various changes can be made thereto within the scope not departing from the gist thereof.

What is claimed is:

1. An imaging device comprising:
a semiconductor substrate having a main surface;
an element forming area of a first conductivity type defined by an element isolation area formed in the semiconductor substrate;
an electrode unit extending in a first direction so as to cross the element forming area in a form to divide the element forming area into a first area and a second area; and
a photoelectric conversion unit formed in the first area, the photoelectric conversion unit including:
a first impurity region of a first conductivity type formed from the surface of the element forming area to a first depth,
a second impurity region of a second conductivity type formed from the first depth to a second depth deeper than the first depth so as to contact the first impurity region,
a third impurity region of a first conductivity type extending in the first direction and formed from the second depth to a position deeper than the second depth in a form to contact the second impurity region, and
a fourth impurity region of a second conductivity type extending in the first direction and formed from the second depth to a position deeper than the second depth in a form to contact the second impurity region, and
the third impurity region and the fourth impurity region being alternately arranged in a plural form along a second direction orthogonal to the first direction in a form to contact each other.

2. The imaging device according to claim 1,
wherein the first conductivity type is a p type, and
wherein the second conductivity type is an n type.

3. The imaging device according to claim 2,
wherein the third impurity region extends in the first direction with a first width,
wherein the fourth impurity region extends in the first direction with a second width, and
wherein assuming that the first width is $X_P$, the second width is $X_N$, the dielectric constant of silicon is $\varepsilon_{Si}$, the elementary charge quantity is q, the impurity concentration of the third impurity region is $N_A$, the impurity concentration of the fourth impurity region is $N_D$, and a depletion potential for depleting the third impurity region and the fourth impurity region is $V_{dep2}$, the first width is set based on the following equation:

$$X_N = \sqrt{8\frac{\varepsilon_{Si}}{q}\frac{N_A}{N_D(N_D+N_A)}V_{dep2}}, \quad (1)$$

and
the second width is set based on the following equation:

$$X_P = \sqrt{8\frac{\varepsilon_{Si}}{q}\frac{N_D}{N_A(N_D+N_A)}V_{dep2}}. \quad (2)$$

4. The imaging device according to claim 3,
wherein assuming that a depletion potential for depleting the second impurity region is $V_{dep1}$,
the impurity concentration of the element forming area, the impurity concentration of the first impurity region, the impurity concentration of the second impurity region, the impurity concentration of the third impurity region, and the impurity concentration of the fourth impurity region are adjusted in such a manner that $V_{dep1} > V_{dep2}$.

5. The imaging device according to claim 1,
wherein the impurity concentration of the third impurity region is set higher than the impurity concentration of the element forming area, and
wherein the impurity concentration of the fourth impurity region is set lower than the impurity concentration of the second impurity region.

6. An imaging device comprising:
a semiconductor substrate having a main surface;
an element forming area of a first conductivity type defined by an element isolation area formed in the semiconductor substrate;
an electrode unit extending in a first direction so as to cross the element forming area in a form to divide the element forming area into a first area and a second area; and
a photoelectric conversion unit including a light emitting element, which is formed in the first area,
the photoelectric conversion unit including:
a first impurity region of a first conductivity type formed from the surface of the element forming area to a first depth,
a second impurity region of a second conductivity type extending in a second direction crossing the first direction and formed from the first depth to a position deeper than the first depth in a form to contact the first impurity region, and
a third impurity region of a first conductivity type extending in the second direction and formed from the first depth to a position deeper than the first depth in a form to contact the first impurity region, and
the second impurity region and the third impurity region being alternately arranged in a plural form along the first direction in a form to contact each other, with the plural portions of the second impurity region connected to each other by a portion of the second impurity region extending in the first direction.

7. The imaging device according to claim 6, wherein the second impurity region extends in the second direction with a first width, and wherein the third impurity region extends in the second direction with a second width.

8. The imaging device according to claim 6, wherein the first conductivity type is a p type, and wherein the second conductivity type is an n type.

9. The imaging device according to claim 6, wherein the impurity concentration of the second impurity region is set higher than the impurity concentration of the element forming area.

10. An imaging device comprising:

a semiconductor substrate having a main surface;

an element forming area of a first conductivity type defined by an element isolation area formed in the semiconductor substrate;

an electrode unit extending in a first direction so as to cross the element forming area in a form to divide the element forming area into a first area and a second area; and a photoelectric conversion unit formed in the first area, the element isolation area having an impurity isolation region of a first conductivity type formed from the main surface of the semiconductor substrate to a first depth, and the photoelectric conversion unit including:

a first impurity region of a first conductivity type formed from the surface of the element forming area to a second depth shallower than the first depth, a second impurity region of a second conductivity type formed from the second depth to a third depth shallower than the first depth so as to contact the first impurity region, and a third impurity region of a second conductivity type being in contact with the second impurity region and formed from the third depth to a position deeper than the third depth along the impurity isolation region while contacting the impurity isolation region.

11. The imaging device according to claim 10, wherein the third impurity region is formed so as to extend in a second direction crossing the first direction with a width.

12. The imaging device according to claim 10, wherein the first conductivity type is a p type, and wherein the second conductivity type is an n type.

13. The imaging device according to claim 10, wherein the impurity concentration of the impurity isolation region is set higher than the impurity concentration of the element forming area.

14. The imaging device according to claim 7, wherein the first conductivity type is a p type, and wherein the second conductivity type is an n type.

15. The imaging device according to claim 11, wherein the first conductivity type is a p type, and wherein the second conductivity type is an n type.

* * * * *